(12) United States Patent
Iizuka et al.

(10) Patent No.: US 10,916,460 B2
(45) Date of Patent: Feb. 9, 2021

(54) WAFER PRODUCING APPARATUS

(71) Applicant: DISCO CORPORATION, Tokyo (JP)

(72) Inventors: Kentaro Iizuka, Tokyo (JP); Naoki Omiya, Tokyo (JP); Takashi Mori, Tokyo (JP); Motomi Kitano, Tokyo (JP); Kazuya Hirata, Tokyo (JP); Hiroshi Kitamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 351 days.

(21) Appl. No.: 16/020,414

(22) Filed: Jun. 27, 2018

(65) Prior Publication Data

US 2019/0006212 A1 Jan. 3, 2019

(30) Foreign Application Priority Data

Jun. 30, 2017 (JP) ................................ 2017-128507

(51) Int. Cl.
| | |
|---|---|
| *H01L 21/67* | (2006.01) |
| *B24B 7/22* | (2006.01) |
| *H01L 21/677* | (2006.01) |
| *B23K 26/00* | (2014.01) |
| *H01L 29/16* | (2006.01) |
| *H01L 21/02* | (2006.01) |

(52) U.S. Cl.
CPC ........ *H01L 21/67219* (2013.01); *B23K 26/00* (2013.01); *B24B 7/228* (2013.01); *H01L 21/67017* (2013.01); *H01L 21/67115* (2013.01); *H01L 21/67721* (2013.01); *H01L 21/02013* (2013.01); *H01L 29/1608* (2013.01)

(58) Field of Classification Search
CPC ........ H01L 21/67219; H01L 21/67017; H01L 21/67115; H01L 21/67721; H01L 21/02013; H01L 29/1608; B23K 26/00; B24B 7/228
See application file for complete search history.

(56) References Cited

U.S. PATENT DOCUMENTS

| | | | |
|---|---|---|---|
| 7,022,000 B2 * | 4/2006 | Mizomoto | B24B 7/228 451/288 |
| 9,649,723 B2 * | 5/2017 | Umeda | B23K 26/40 |
| 9,884,389 B2 * | 2/2018 | Hirata | B28D 5/0005 |

(Continued)

FOREIGN PATENT DOCUMENTS

| | | |
|---|---|---|
| JP | 2000094221 A | 4/2000 |
| JP | 2013049161 A | 3/2013 |

*Primary Examiner* — Dung Van Nguyen
(74) *Attorney, Agent, or Firm* — Greer Burns & Crain Ltd.

(57) ABSTRACT

A wafer producing apparatus for producing an SiC wafer from a single-crystal SiC ingot includes an ingot grinding unit, a laser applying unit that applies a pulsed laser beam having a wavelength that is transmittable through the single-crystal SiC ingot while positioning a focal point of the pulsed laser beam in the single-crystal SiC ingot at a depth corresponding to the thickness of the SiC wafer to be produced from an upper surface of the single-crystal SiC ingot, thereby forming a peel-off layer in the single-crystal SiC ingot, a wafer peeling unit that peels the SiC wafer off the peel-off layer in the single-crystal SiC ingot, and a delivery unit assembly that delivers the single-crystal SiC ingot between the ingot grinding unit, the laser applying unit, and the wafer peeling unit.

9 Claims, 15 Drawing Sheets

(56) References Cited

U.S. PATENT DOCUMENTS

2009/0011572 A1* 1/2009 Kaneko ............ H01L 21/67092
438/463
2012/0088441 A1* 4/2012 Yamanaka ............ H01L 21/304
451/402

* cited by examiner

WAFER PRODUCING APPARATUS

BACKGROUND OF THE INVENTION

Field of the Invention

The present invention relates to a wafer producing apparatus for producing an SiC wafer from a single-crystal SiC ingot.

Description of the Related Art

Devices such as integrated circuits (ICs), large scale integration (LSI) circuits, light-emitting diodes (LEDs), and so on are formed in areas demarcated on the face sides of wafers made of Si (silicon), $Al_2O_3$ (sapphire), or the like by a grid of projected dicing lines. Power devices, LEDs, and so on are formed in areas demarcated on the face sides of wafers made of single-crystal SiC (silicon carbide) by a grid of projected dicing lines. A wafer with devices formed thereon is processed along the projected dicing lines by a cutting apparatus, a laser processing apparatus, or the like, and is divided into individual device chips, which will be used in electric appliances including mobile phones, personal computers, and so on.

Generally, wafers on which to form devices are produced by slicing a cylindrical ingot by a wire saw. The face and reverse sides of a wafer sliced from an ingot are ground to a mirror finish (see, for example, Japanese Patent Laid-open No. 2000-94221). However, slicing an ingot into wafers with a wire saw and grinding the face and reverse sides of the sliced wafers is uneconomical as most (70% to 80%) of the ingot stock is discarded. Single-crystal SiC ingots suffer additional problems in that their productivity is low because they are relatively hard, are difficult to cut with a wire saw, and take a considerable time to cut, and they have a high unit cost, so that much remains to be done in the production of SiC wafers with high efficiency.

There has been proposed a technology in which a laser beam having a wavelength that is transmittable through single-crystal SiC is applied to a single-crystal SiC ingot while its focal point is positioned within the single-crystal SiC ingot, thereby forming a peel-off layer on a projected severance plane therein, and an SiC wafer is peeled off from the single-crystal SiC ingot along the projected severance plane with the peel-off layer formed thereon (see, for example, Japanese Patent Laid-open No. 2013-49161).

SUMMARY OF THE INVENTION

However, the proposed technology is problematic in that its production efficiency is poor because the step of forming a peel-off layer in a single-crystal SiC ingot, the step of peeling off an SiC wafer from the single-crystal SiC ingot, and the step of grinding an upper surface of the single-crystal SiC ingot to planarize the same are manually performed.

It is therefore an object of the present invention to provide a wafer producing apparatus which is capable of automatically producing an SiC wafer from a single-crystal SiC ingot.

In accordance with an aspect of the present invention, there is provided a wafer producing apparatus for producing an SiC wafer from a single-crystal SiC ingot, including an ingot grinding unit that includes a first holding table for holding the single-crystal SiC ingot thereon and grinding means for grinding and planarizing an upper surface of the single-crystal SiC ingot held on the first holding table, a laser applying unit that includes a second holding table for holding the single-crystal SiC ingot thereon and laser applying means for applying a pulsed laser beam having a wavelength that is transmittable through the single-crystal SiC ingot while positioning a focal point of the pulsed laser beam in the single-crystal SiC ingot at a depth corresponding to the thickness of the SiC wafer to be produced from the upper surface of the single-crystal SiC ingot held on the second holding table, thereby forming a peel-off layer in the single-crystal SiC ingot, a wafer peeling unit that includes a third holding table for holding the single-crystal SiC ingot thereon and wafer peeling means for holding the upper surface of the single-crystal SiC ingot held on the third holding table and peeling the SiC wafer off the peel-off layer, a wafer housing unit configured to house the SiC wafer that has been peeled off, and a delivery unit assembly configured to deliver the single-crystal SiC ingot between the ingot grinding unit, the laser applying unit, and the wafer peeling unit.

Preferably, the wafer producing apparatus further includes an ingot housing unit configured to house the single-crystal SiC ingot therein, in which the delivery unit assembly delivers the single-crystal SiC ingot from the ingot housing unit to the laser applying unit. Preferably, the wafer producing apparatus further includes an ingot cleaning unit configured to clean the single-crystal SiC ingot, in which the delivery unit assembly delivers the single-crystal SiC ingot from the ingot grinding unit to the ingot cleaning unit and also delivers the single-crystal SiC ingot from the ingot cleaning unit to the laser applying unit.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
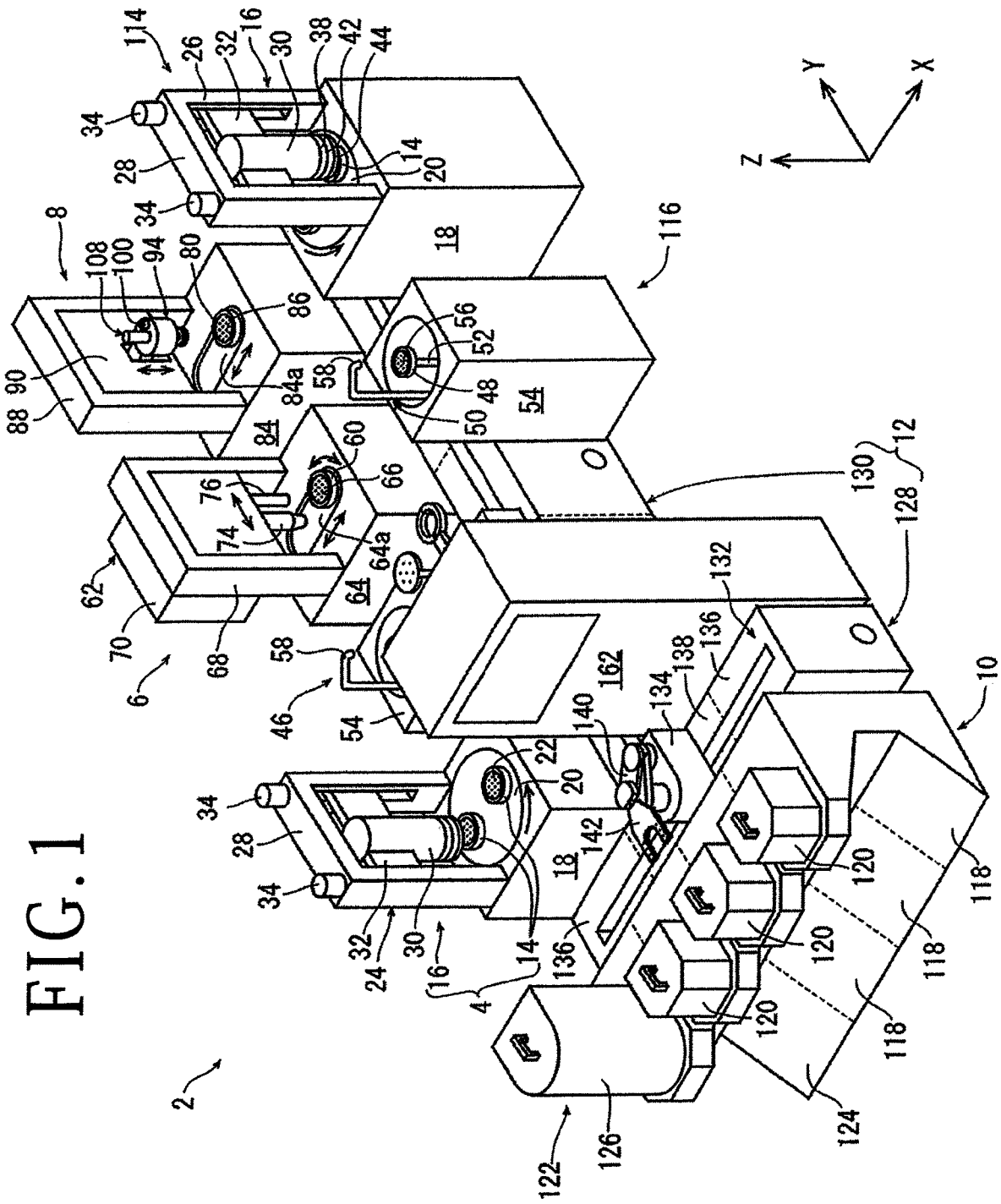
FIG. 1 is a perspective view of a wafer producing apparatus according to an embodiment of the present invention.

A wafer producing apparatus according to an embodiment of the present invention will be described below with reference to the drawings. As depicted in FIG. 1, the wafer producing apparatus, denoted by 2, according to the present embodiment includes an ingot grinding unit 4, a laser applying unit 6, a wafer peeling unit 8, a wafer housing unit 10 for housing an SiC wafer peeled off from a single-crystal SiC ingot, and a delivery unit assembly 12 for delivering a single-crystal SiC ingot between the ingot grinding unit 4, the laser applying unit 6, and the wafer peeling unit 8.

Figure 2:
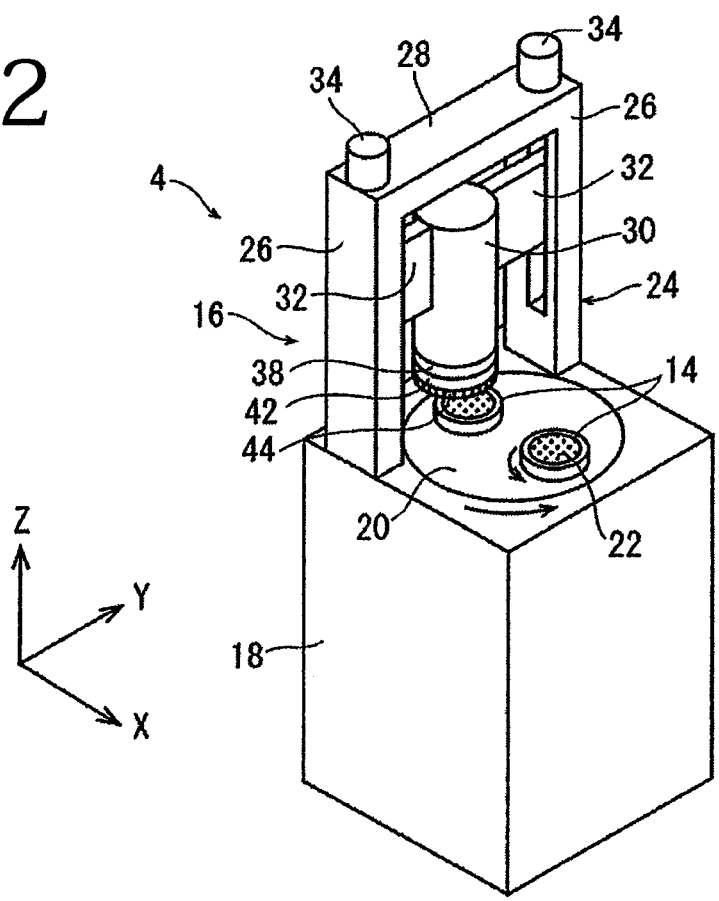
FIG. 2 is a perspective view of an ingot grinding unit of the wafer producing apparatus depicted in FIG. 1.

The ingot grinding unit 4 will be described in detail below with reference to FIG. 2. The ingot grinding unit 4 includes a pair of first holding tables 14, each having a circular shape, for holding single-crystal SiC ingots thereon and grinding means 16 for grinding and planarizing an upper surface of the single-crystal SiC ingot held on one at a time of the first holding tables 14. The ingot grinding unit 4 also includes a base 18 in the shape of a rectangular parallelepiped and a circular turntable 20 rotatably mounted on an upper surface of the base 18. The turntable 20 is rotatable about an axis, serving as its center of rotation, extending in a Z-axis direction through the diametrical center of the turntable 20, by a turntable electric motor, not depicted, disposed in the base 18. According to the present embodiment, the first holding tables 14 are rotatably disposed on an upper surface of the turntable 20 in point symmetry across a symmetric point at the diametrical center, i.e., the center of rotation, of the turntable 20. When the turntable 20 turns about its center of rotation, the first holding tables 14 are alternately brought into a grinding position (remoter from the viewer of FIG. 2), where the grinding means 16 grinds a single-crystal SiC ingot held on the first holding table 14 and an ingot loading/unloading position (closer to the viewer of FIG. 2), where a single-crystal SiC ingot is loaded on or unloaded from the first holding table 14.

Each of the first holding tables 14 is rotatable about an axis, serving as its center of rotation, extending in the Z-axis direction through the diametrical center of the first holding table 14 by a first holding table electric motor, not depicted, mounted on a lower surface of the turntable 20. A circular suction chuck 22 made of a porous material and extending substantially horizontally is disposed on an upper surface of the first holding table 14. The suction chuck 22 is connected to suction means, not depicted, through a suction channel, not depicted. The first holding table 14 attracts and holds under suction a single-crystal SiC ingot placed on an upper surface of the suction chuck 22 by a suction force generated on the upper surface of the suction chuck 22 by the suction means. The Z-axis direction represents a vertical direction that is indicated by the arrow Z in FIG. 2 and other figures. In FIG. 2 and other figures, an X-axis direction that is indicated by the arrow X represents a direction perpendicular to the Z-axis direction, and a Y-axis direction that is indicated by the arrow Y represents a direction perpendicular to the X-axis and Z-axis directions. The X-axis and Y-axis directions jointly define an XY plane that lies substantially horizontally.

Figure 3:
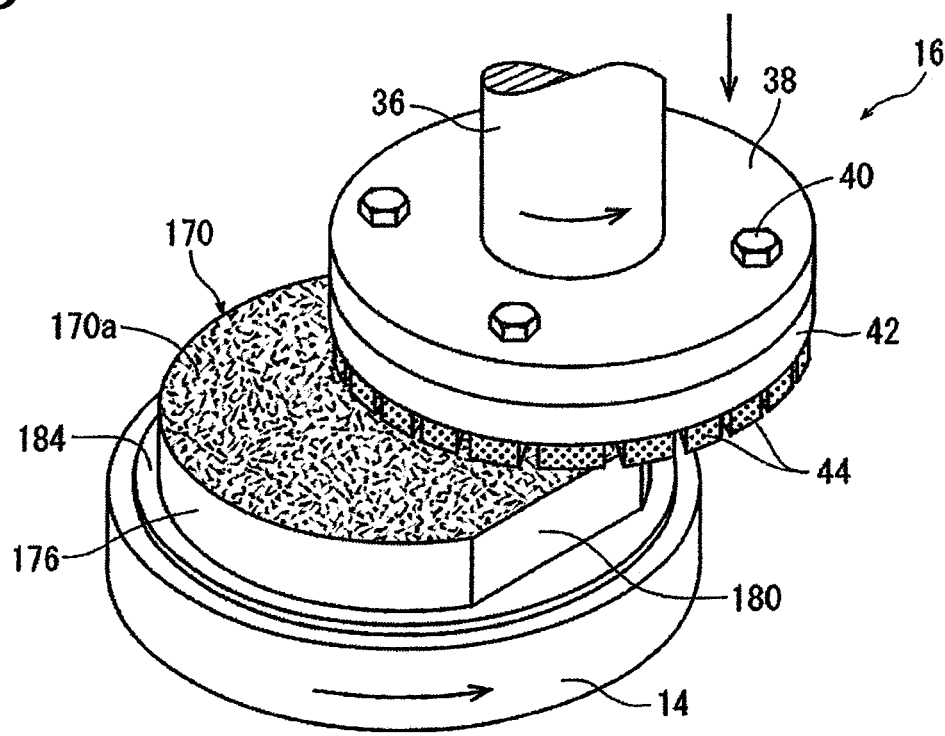
FIG. 3 is an enlarged fragmentary perspective view of the ingot grinding unit depicted in FIG. 2.

The ingot grinding unit 4 will further be described below with reference to FIGS. 2 and 3. According to the present embodiment, as depicted in FIG. 2, the grinding means 16 includes a portal-shaped support frame 24 mounted on the upper surface of the base 18. The support frame 24 has a pair of columns 26 spaced from each other in the Y-axis direction and extending upwardly from the upper surface of the base 18 and a beam 28 extending in the Y-axis direction between the upper ends of the columns 26. A hollow cylindrical spindle housing 30 is movably supported on the columns 26 by a pair of rectangular joint arms 32 for vertical movement in the Z-axis direction or the opposite direction. A pair of lifting/lowering electric motors 34 for lifting and lowering the spindle housing 30 in the Z-axis direction or the opposite direction are mounted on an upper surface of the beam 28. The lifting/lowering electric motors 34 are connected to the upper ends of ball screws, not depicted, that extend vertically in the Z-axis direction in the columns 26. The ball screws are threaded through respective nuts, not depicted, fixed to the respective joint arms 32. When the lifting/lowering electric motors 34 are energized, their rotation is converted by the ball screws into linear motion of the nuts and hence the joint arms 32, which move the spindle housing 30 vertically in the Z-axis direction or the opposite direction.

A cylindrical spindle 36 (see FIG. 3) is rotatably supported in the spindle housing 30 for rotation about an axis extending in the Z-axis direction. The spindle 36 is rotatable about its axis extending in the Z-axis direction by a spindle electric motor, not depicted, housed in the spindle housing 30. As depicted in FIG. 3, the spindle 36 has its lower end fixed to a disk-shaped wheel mount 38 having a lower surface to which an annular grinding wheel 42 is fastened by a plurality of bolts 40. A plurality of circumferentially spaced grinding stones 44 that are arranged in an annular array are fixed to an outer peripheral edge portion of a lower surface of the grinding wheel 42. As depicted in FIG. 3, the center of rotation of the grinding wheel 42 is offset from the center of rotation of the first holding table 14 such that when the first holding table 14 is in the grinding position, the grinding stones 44 pass through the center of rotation of the first holding table 14. Therefore, in the grinding means 16, when the upper surface of the single-crystal SiC ingot held on the first holding table 14 and the grinding stones 44 are held in contact with each other while the first holding table 14 and the grinding wheel 42 are rotating with respect to each other, the upper surface of the single-crystal SiC ingot is ground in its entirety by the grinding stones 44, so that the upper surface of the single-crystal SiC ingot held on the first holding table 14 can be ground and planarized.

The wafer producing apparatus 2 further includes an ingot cleaning unit 46 for cleaning a single-crystal SiC ingot. According to the present embodiment, as depicted in FIG. 1, the ingot cleaning unit 46 is disposed adjacent to the ingot grinding unit 4. The ingot cleaning unit 46 will be described in detail below with reference to FIG. 4. The ingot cleaning unit 46 includes a circular chuck table 48 for holding a single-crystal SiC ingot thereon and ejector means 50 for selectively ejecting cleaning water and drying air to the single-crystal SiC ingot held on the chuck table 48. The chuck table 48 is fixed at its lower end to the upper end of a cylindrical rotational shaft 52 extending downwardly. The rotational shaft 52 has a lower end coupled to a chuck table electric motor, not depicted, housed in a housing 54 of the ingot cleaning unit 46. The chuck table 48 is rotatable about an axis, serving as its center of rotation, extending in the Z-axis direction through the diametrical center of the chuck table 48, by the chuck table electric motor. A circular suction chuck 56 made of a porous material and extending substantially horizontally is disposed on an upper surface of the chuck table 48. The suction chuck 56 is connected to suction means, not depicted, through a suction channel, not depicted. The chuck table 48 attracts and holds under suction a single-crystal SiC ingot placed on an upper surface of the suction chuck 56 by a suction force generated on the upper surface of the suction chuck 56 by the suction means.

Figure 4:
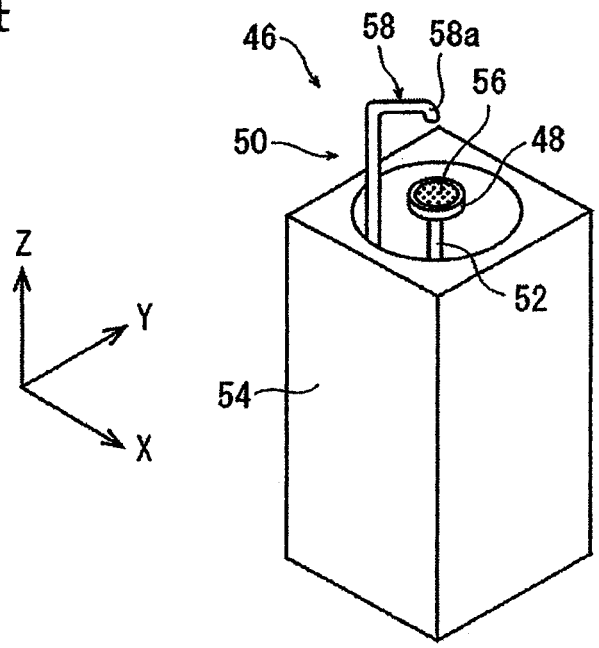
FIG. 4 is a perspective view of an ingot cleaning unit of the wafer producing apparatus depicted in FIG. 1.

The ingot cleaning unit 46 will further be described below with reference to FIG. 4. The ejector means 50 of the ingot cleaning unit 46 includes a tubular pipe 58 having an ejection port 58a disposed above the diametrical center of the chuck table 48, a cleaning water supply source, not depicted, for supplying cleaning water to the pipe 58, and a pressurized air source, not depicted, for supplying drying air to the pipe 58. The cleaning water supply source and the pressurized air source are selectively connected to the pipe 58. When the pipe 58 is connected to the cleaning water supply source, the ejector means 50 ejects cleaning water from the ejection port 58a of the pipe 58 toward the single-crystal SiC ingot held on the chuck table 48. When the pipe 58 is connected to the pressurized air source, the ejector means 50 ejects drying air from the ejection port 58a of the pipe 58 toward the single-crystal SiC ingot held on the chuck table 48. When the ingot cleaning unit 46 is in operation, the chuck table 48 with the single-crystal SiC ingot held thereon is rotated about its own axis and at the same time the ejection port 58a of the pipe 58 ejects cleaning water toward the single-crystal SiC ingot, thereby cleaning the single-crystal SiC ingot and then expelling the cleaning water off the single-crystal SiC ingot under centrifugal forces generated by the rotation of the chuck table 48. In addition, when the ejection port 58a of the pipe 58 ejects drying air toward the single-crystal SiC ingot, it blows remaining cleaning water that may not have been expelled under the centrifugal forces, off from the single-crystal SiC ingot, thereby drying the single-crystal SiC ingot.

Figure 5:
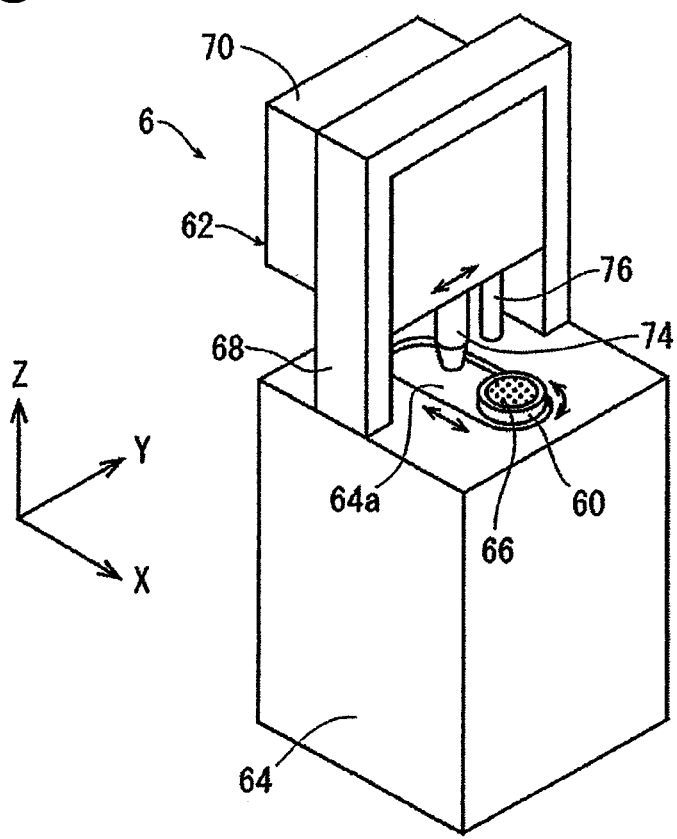
FIG. 5 is a perspective view of a laser applying unit of the wafer producing apparatus depicted in FIG. 1.

The laser applying unit 6 will be described below with reference to FIGS. 1 and 5. As depicted in FIG. 1, the laser applying unit 6, which is disposed adjacent to the ingot cleaning unit 46, includes a second holding table 60 of a circular shape for holding a single-crystal SiC ingot thereon and laser applying means 62 for applying a laser beam that has a wavelength transmittable through the single-crystal SiC ingot to the single-crystal SiC ingot held on the second holding table 60 while positioning a focal point of the laser beam in the single-crystal SiC ingot at a depth corresponding to the thickness of an SiC wafer to be produced, from the upper surface of the single-crystal SiC ingot on the second holding table 60. According to the present embodiment, as depicted in FIG. 5, the laser applying unit 6 includes a base 64 in the shape of a rectangular parallelepiped. The base 64 has a downwardly recessed accommodating recess 64a defined in an upper surface of the base 64 and elongate in the X-axis direction. The second holding table 60 is accommodated in the accommodating recess 64a and is movable in the X-axis direction or the opposite direction and rotatable about an axis extending in the Z-axis direction. The base 64 houses therein X-axis moving means, not depicted, mounted therein for moving the second holding table 60 in the X-axis direction or the opposite direction and a second holding table electric motor, not depicted, mounted therein for rotating the second holding table 60 about the axis, serving as the center of rotation, passing through the diametrical center of the second holding table 60 and extending in the Z-axis direction.

The X-axis moving means may have, for example, a ball screw, not depicted, extending in the X-axis direction and threaded through a nut, not depicted, fixed to the second holding table 60 and an electric motor, not depicted, coupled to an end of the ball screw. When the electric motor of the X-axis moving means is energized, its rotation is converted by the ball screw into linear motion of the nut that is transmitted to the second holding table 60, thereby moving the second holding table 60 in the X-axis direction or the opposite direction along the accommodating recess 64a. The second holding table electric motor is movable in the X-axis direction or the opposite direction in unison with the second holding table 60 by the X-axis moving means. Therefore, even when the second holding table 60 is moved in the X-axis direction or the opposite direction by the X-axis moving means, the second holding table electric motor can rotate the second holding table 60 about its own axis. A circular suction chuck 66 made of a porous material and extending substantially horizontally is disposed on an upper surface of the second holding table 60. The suction chuck 66 is connected to suction means, not depicted, through a suction channel, not depicted. The second holding table 60 attracts and holds under suction a single-crystal SiC ingot placed on an upper surface of the suction chuck 66 by a suction force generated on the upper surface of the suction chuck 66 by the suction means.

The laser applying unit 6 will further be described below with reference to FIG. 5. According to the present embodiment, the laser applying means 62 of the laser applying unit 6 includes a portal-shaped support frame 68 mounted on an upper surface of the base 64, a casing 70 in the shape of a rectangular parallelepiped supported in the support frame 68, a Y-axis movable member, not depicted, mounted on a lower end of the casing 70 and movable in the Y-axis direction or the opposite direction, and Y-axis moving means, not depicted, for moving the Y-axis movable member in the Y-axis direction or the opposite direction. The Y-axis moving means may have, for example, a ball screw, not depicted, extending in the Y-axis direction and threaded through a nut, not depicted, fixed to the Y-axis movable member and an electric motor, not depicted, coupled to an end of the ball screw. When the electric motor of the Y-axis moving means is energized, its rotation is converted by the ball screw into linear motion of the nut that is transmitted to the Y-axis movable member, thereby moving the Y-axis movable member in the Y-axis direction or the opposite direction along a guide rail, not depicted, extending in the Y-axis direction.

Figure 6:
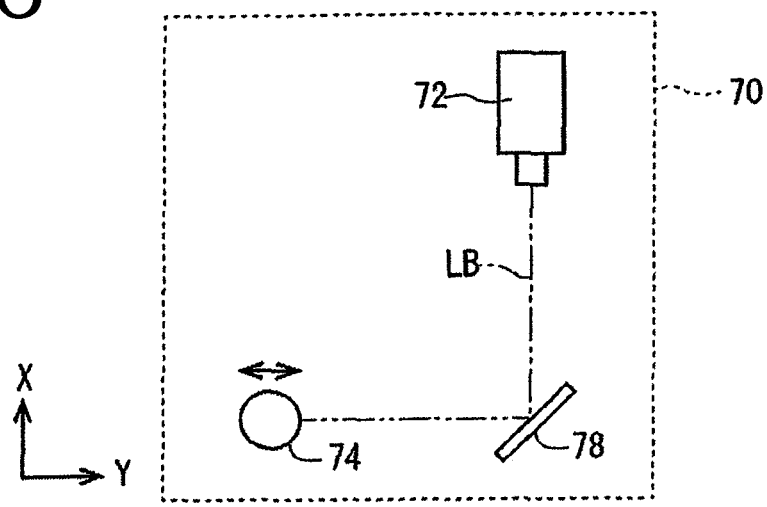
FIG. 6 is a block diagram of laser applying means of the laser applying unit depicted in FIG. 5.

The laser applying means 62 will further be described below with reference to FIGS. 5 and 6. The laser applying means 62 also includes a laser oscillator 72 (see FIG. 6) housed in the casing 70, a beam condenser 74 (see FIGS. 5 and 6) movably mounted on the lower end of the Y-axis movable member for vertical movement in the Z-axis direction or the opposite direction, alignment means 76 (see FIG. 5) mounted on the lower end of the Y-axis movable member and spaced from the beam condenser 74 in the Y-axis direction, and focal point position adjusting means, not depicted, for moving the beam condenser 74 vertically in the Z-axis direction or the opposite direction to adjust the position in the Z-axis direction of a focal point formed by the beam condenser 74. The laser oscillator 72 oscillates a pulsed laser beam LB having a wavelength transmittable through a single-crystal SiC ingot. The beam condenser 74 has a condensing lens, not depicted, for focusing the pulsed laser beam LB oscillated by the laser oscillator 72. The alignment means 76 is arranged to capture an image of the single-crystal SiC ingot held on the second holding table 60 to detect a region of the single-crystal SiC ingot which is to be laser-processed. The focal point position adjusting means may have, for example, a ball screw, not depicted, extending in the Z-axis direction and threaded through a nut, not depicted, fixed to the beam condenser 74 and an electric motor, not depicted, coupled to an end of the ball screw. When the electric motor of the focal point position adjusting means is energized, its rotation is converted by the ball screw into linear motion of the nut that is transmitted to the beam condenser 74, thereby moving the beam condenser 74 in the Z-axis direction or the opposite direction along a guide rail, not depicted, extending in the Z-axis direction, thereby to adjust the position in the Z-axis direction of the focal point of the pulsed laser beam LB that is focused by the condensing lens.

The laser applying means 62 will still further be described below with reference to FIG. 6. The casing 70 houses therein a first mirror 78 spaced from the laser oscillator 72 in the X-axis direction, for reflecting the pulsed laser beam LB that is emitted from the laser oscillator 72 along an optical path represented by the X-axis direction to convert the optical axis into an optical path along the Y-axis direction, i.e., to cause the pulsed laser beam LB to travel along the Y-axis direction, and a second mirror, not depicted, disposed above the beam condenser 74 and spaced from the first mirror 78 in the Y-axis direction, for converting the optical path of the pulsed laser beam LB reflected by the first mirror 78 from the Y-axis direction to the Z-axis direction to guide the pulsed laser beam LB to the beam condenser 74. The second mirror is mounted on the Y-axis movable member, so that when the Y-axis movable member is moved by the Y-axis moving means, the second mirror is moved in the Y-axis direction or the opposite direction in unison with the beam condenser 74 and the alignment means 76. The pulsed laser beam LB that is emitted from the laser oscillator 72 along the optical path represented by the X-axis direction is reflected by the first mirror 78 to travel to the second mirror along the optical path converted from the X-axis direction to the Y-axis direction, and then reflected by the second mirror to travel to the beam condenser 74 along the optical path converted from the Y-axis direction to the Z-axis direction. The pulsed laser beam LB that is applied to the beam condenser 74 is then focused by the condensing lens thereof and applied to the single-crystal SiC ingot held on the second holding table 60.

Even when the beam condenser 74 is moved in the Y-axis direction or the opposite direction by moving the Y-axis movable member with the Y-axis moving means or even when the beam condenser 74 is moved in the Z-axis direction or the opposite direction by the focal point position adjusting means, the pulsed laser beam LB emitted from the laser oscillator 72 parallel to the X-axis direction is reflected by the first mirror 78 to travel to the second mirror along the optical path converted from the X-axis direction to the Y-axis direction, and then reflected by the second mirror to travel to the beam condenser 74 along the optical path converted from the Y-axis direction to the Z-axis direction. When the laser applying means 62 thus constructed is in operation, the alignment means 76 captures an image of the single-crystal SiC ingot held on the second holding table 60 to detect a region of the single-crystal SiC ingot which is to be laser-processed, and the focal point position adjusting means moves the beam condenser 74 in the Z-axis direction or the opposite direction to position the focal point of the pulsed laser beam LB, whose wavelength is transmittable through the single-crystal SiC ingot, at a depth corresponding to the thickness of an SiC wafer to be produced, from the upper surface of the single-crystal SiC ingot on the second holding table 60. While the Y-axis moving means is appropriately moving the beam condenser 74 in the Y-axis direction, the beam condenser 74 applies the pulsed laser beam LB to the single-crystal SiC ingot held on the second holding table 60 to form a peel-off layer in the single-crystal SiC ingot. When the pulsed laser beam LB is applied to the single-crystal SiC ingot held on the second holding table 60, the second holding table 60 may be moved in the X-axis direction or the opposite direction by the X-axis moving means.

Figure 7:
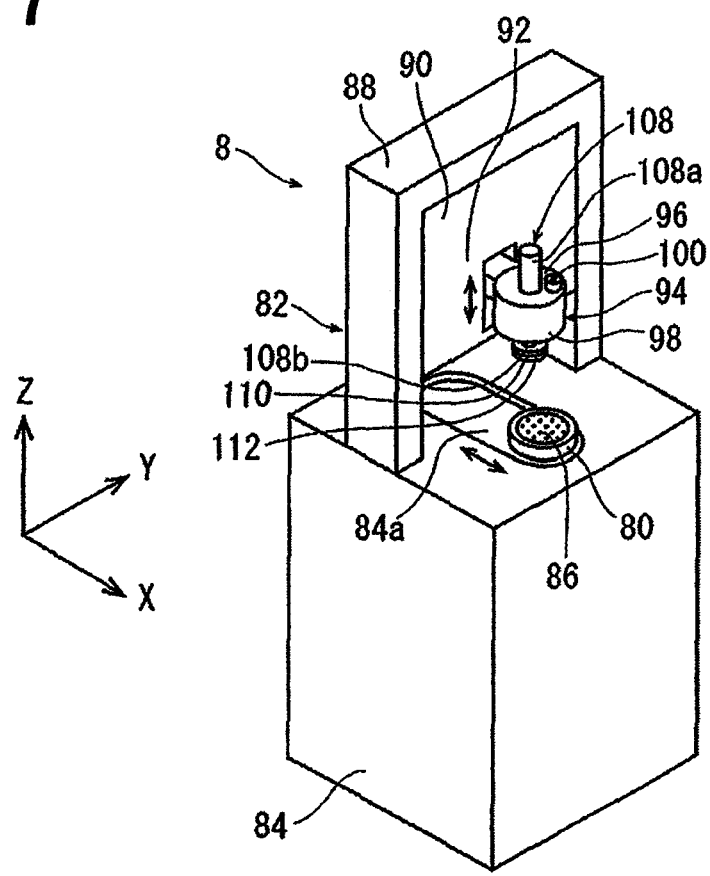
FIG. 7 is a perspective view of a wafer peeling unit of the wafer producing apparatus depicted in FIG. 1.

The wafer peeling unit 8 will be described in detail below with reference to FIGS. 1 and 7. As depicted in FIG. 1, the wafer peeling unit 8, which is disposed adjacent to the laser applying unit 6, includes at least a third holding table 80 of a circular shape for holding a single-crystal SiC ingot thereon and wafer peeling means 82 for holding an upper surface of the single-crystal SiC ingot held on the third holding table 80 and peeling an SiC wafer off a peel-off layer from the single-crystal SiC ingot. According to the present embodiment, as depicted in FIG. 7, the wafer peeling unit 8 includes a base 84 in the shape of a rectangular parallelepiped. The base 84 has a downwardly recessed accommodating recess 84a defined in an upper surface of the base 84 and elongate in the X-axis direction. The third holding table 80 is accommodated in the accommodating recess 84a and is movable in the X-axis direction or the opposite direction. The base 84 houses therein X-axis moving means, not depicted, mounted therein for moving the third holding table 80 in the X-axis direction or the opposite direction.

The X-axis moving means may have, for example, a ball screw, not depicted, extending in the X-axis direction and threaded through a nut, not depicted, fixed to the third holding table 80 and an electric motor, not depicted, coupled to an end of the ball screw. When the electric motor of the X-axis moving means is energized, its rotation is converted by the ball screw into linear motion of the nut that is transmitted to the third holding table 80, thereby moving the third holding table 80 in the X-axis direction or the opposite direction along the accommodating recess 84a. A circular suction chuck 86 made of a porous material and extending substantially horizontally is disposed on an upper surface of the third holding table 80. The suction chuck 86 is connected to suction means, not depicted, through a suction channel, not depicted. The third holding table 80 attracts and holds under suction a single-crystal SiC ingot placed on an upper surface of the suction chuck 86 by a suction force generated on the upper surface of the suction chuck 86 by the suction means.

The wafer peeling unit 8 will further be described below with reference to FIG. 7. According to the present embodiment, the wafer peeling means 82 of the wafer peeling unit 8 includes a portal-shaped support frame 88 mounted on the upper surface of the base 84, an casing 90 in the shape of a rectangular parallelepiped supported in the support frame 88, an arm 92 extending in the X-axis direction from a proximal end portion thereof that is movably supported in the casing 90 for vertical movement in the Z-axis direction or the opposite direction, and arm moving means, not depicted, for vertically moving the arm 92 in the Z-axis direction or the opposite direction. The arm moving means may have, for example, a ball screw, not depicted, extending in the Z-axis direction and threaded through a nut, not depicted, fixed to the proximal end portion of the arm 92 and an electric motor, not depicted, coupled to an end of the ball screw. When the electric motor of the arm moving means is energized, its rotation is converted by the ball screw into linear motion of the nut that is transmitted to the arm 92, thereby moving the arm 92 in the Z-axis direction or the opposite direction along a guide rail, not depicted, housed in the casing 90 and extending in the Z-axis direction.

Figure 8:
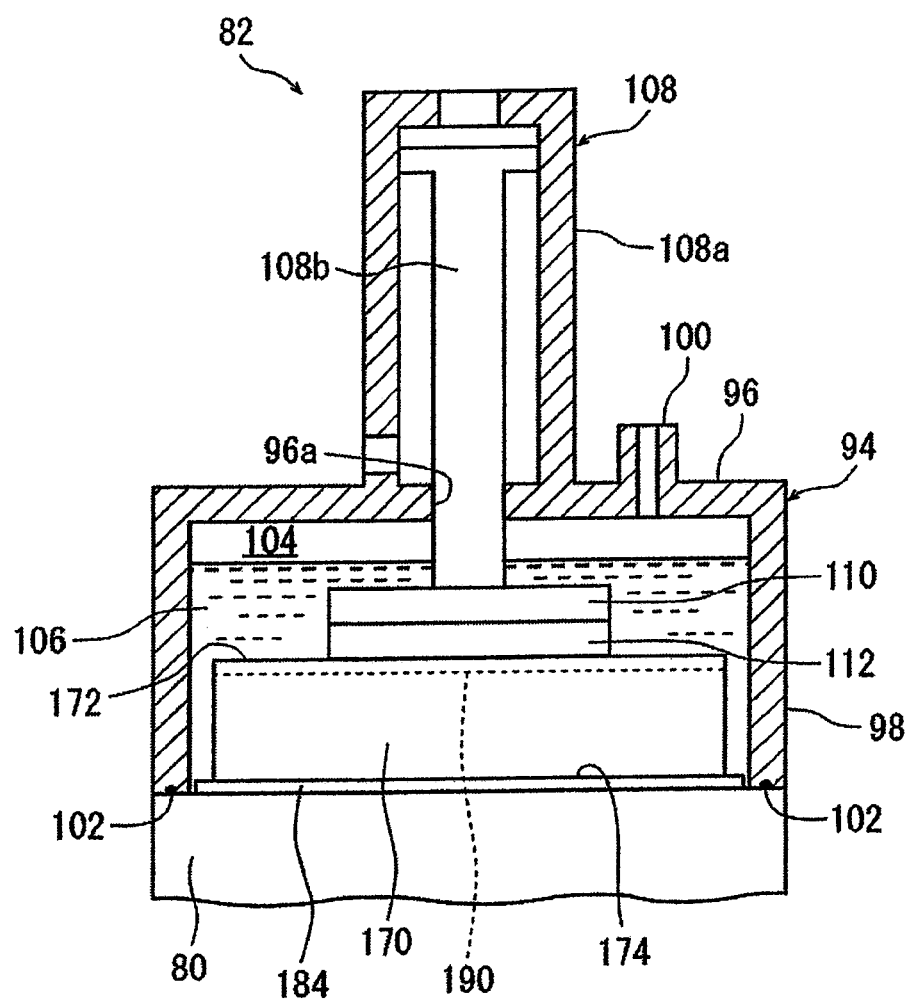
FIG. 8 is a fragmentary cross-sectional view of the wafer peeling unit depicted in FIG. 7.

The wafer peeling unit 8 will still further be described below with reference to FIGS. 7 and 8. As depicted in FIG. 7, a liquid container 94 is fixed to a distal end of the arm 92 for storing a liquid therein in cooperation with the third holding table 80 at the time an SiC wafer is peeled off from the single-crystal SiC ingot on the third holding table 80. The liquid container 94 has a circular top wall 96 and a hollow cylindrical side wall 98 extending downwardly from the peripheral edge of the top wall 96, and is open at its lower end. The side wall 98 has an outside diameter equal to or smaller than the diameter of the third holding table 80. When the arm 92 is lowered, the side wall 98 has its lower end brought into contact with an upper surface of the third holding table 80. The top wall 96 includes a tubular liquid supply port 100 that provides fluid communication between the outside and inside of the liquid container 94. The liquid supply port 100 is connected to liquid supply means, not depicted, through a fluid channel, not depicted. As depicted in FIG. 8, an annular packing 102 is attached to the lower end of the side wall 98. When the arm moving means lowers the arm 92 until the lower end of the side wall 98 is brought into contact with the upper surface of the third holding table 80, a liquid storing space 104 is defined between the upper surface of the third holding table 80 and an inner surface of the liquid container 94. A liquid 106 is then supplied from the liquid supply means through the tubular liquid supply port 100 to the liquid storing space 104 and is prevented from leaking from the liquid storing space 104 by the packing 102.

The wafer peeling unit 8 will yet still further be described below with reference to FIGS. 7 and 8. An air cylinder 108 is mounted on the top wall 96 of the liquid container 94. The air cylinder 108 includes a cylinder tube 108a extending upwardly from an upper surface of the top wall 96. The air cylinder 108 also includes a piston rod 108b slidably disposed in the cylinder tube 108a and having a lower end portion extending through a through opening 96a defined in the top wall 96 and projecting downwardly from the top wall 96. The projecting lower end portion of the piston rod 108b has a lower end to which there is fixed a disk-shaped ultrasonic vibration generator 110 that may be made of piezoelectric ceramics or the like. A disk-shaped suction member 112 is fixed to a lower surface of the ultrasonic vibration generator 110. The suction member 112 has a plurality of suction holes, not depicted, defined in a lower surface thereof that are connected to suction means, not depicted, through a fluid channel, not depicted. When a suction force generated by the suction means acts through the suction holes on the lower surface of the suction member 112, the suction member 112 attracts and holds under suction a single-crystal SiC ingot on the lower surface thereof. The wafer peeling means 82 operates as follows. The arm moving means lowers the arm 92 until the lower end of the side wall 98 is brought into intimate contact with the upper surface of the third holding table 80 which has been holding a single-crystal SiC ingot thereon that has a peel-off layer formed therein by the laser applying unit 6. The air cylinder 108 is actuated to lower the piston rod 108b until the suction member 112 contacts the upper surface of the single-crystal SiC ingot, whereupon the suction member 112 attracts and holds under suction a single-crystal SiC ingot on the lower surface thereof. Thereafter, the ultrasonic vibration generator 110 is energized to apply ultrasonic vibrations to the single-crystal SiC ingot after the liquid 106 is housed in the liquid storing space 104, thereby peeling an SiC wafer off the peel-off layer as a severance initiating point from the single-crystal SiC ingot.

The wafer producing apparatus 2 also includes a wafer grinding unit 114 for grinding and planarizing a peeled-off surface of the SiC wafer that has been peeled off from the single-crystal SiC ingot and a wafer cleaning unit 116 for cleaning the SiC wafer. According to the present embodiment, as depicted in FIG. 1, the wafer grinding unit 114 is disposed in facing relation to the wafer peeling unit 8, whereas the wafer cleaning unit 116 is disposed adjacent to the wafer grinding unit 114. The wafer grinding unit 114 may be identical in structure to the ingot grinding unit 4, and will not be described in detail below with identical parts thereof being denoted by identical reference symbols indicating those of the ingot grinding unit 4. However, the grinding stones 44 of the wafer grinding unit 114 may be grinding stones that are different from the grinding stones 44 of the ingot grinding unit 4, i.e., grinding stones whose abrasive grains have different grain sizes and grain densities. The wafer cleaning unit 116 may be identical in structure to the ingot cleaning unit 46, and will not be described in detail below with identical parts thereof being denoted by identical reference symbols indicating those of the ingot cleaning unit 46. According to the present embodiment, the wafer producing apparatus 2 includes both the ingot cleaning unit 46 and the wafer cleaning unit 116. However, the wafer producing apparatus 2 may be arranged such that one of the ingot cleaning unit 46 and the wafer cleaning unit 116 may clean both single-crystal SiC ingots and SiC wafers.

Figure 9:
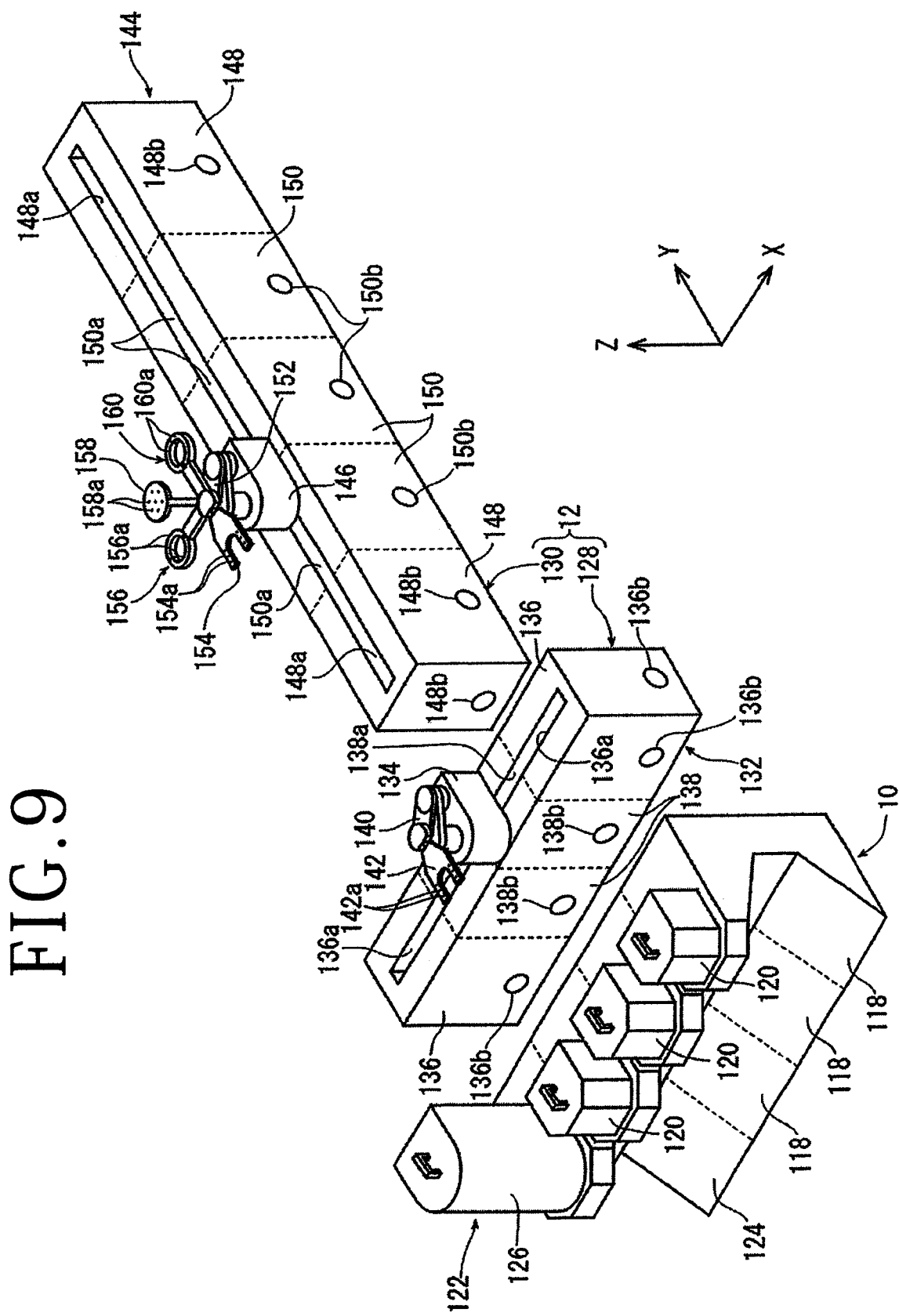
FIG. 9 is a perspective view of a wafer housing unit, an ingot housing unit, and a delivery unit assembly of the wafer producing apparatus depicted in FIG. 1.

The wafer housing unit 10 will be described in detail below with reference to FIGS. 1 and 9. According to the present embodiment, the wafer housing unit 10 includes three wafer cassette tables 118 arrayed along the X-axis direction and three wafer cassettes 120 detachably mounted on respective upper surfaces of the wafer cassette tables 118. Each of the wafer cassettes 120 is capable of housing a plurality of SiC wafers at vertically spaced intervals therein. As depicted in FIGS. 1 and 9, the wafer producing apparatus 2 further includes an ingot housing unit 122 for housing a plurality of single-crystal SiC ingots therein. According to the present embodiment, the ingot housing unit 122 includes an ingot cassette table 124 disposed adjacent to one of the wafer cassette tables 118 at an end of their array and an ingot cassette 126 detachably mounted on an upper surface of the ingot cassette table 124. The ingot cassette 126 is capable of housing a plurality of single-crystal SiC ingots at vertically spaced intervals therein. The ingot cassette table 124 is denoted by the different reference numeral from the reference numeral denoting the wafer cassette tables 118. However, as can be understood from FIGS. 1 and 9, the ingot cassette table 124 may be identical in structure to the wafer cassette tables 118.

The delivery unit assembly 12 will be described below with reference to FIGS. 1 and 9 or mainly FIG. 9. According to the present embodiment, the delivery unit assembly 12 includes a first delivery unit 128 for unloading a single-crystal SiC ingot from the ingot housing unit 122 and housing an SiC wafer peeled off from the single-crystal SiC ingot into the wafer housing unit 10, and a second delivery unit 130 for receiving the single-crystal SiC ingot unloaded from the ingot housing unit 122 from the first delivery unit 128, delivering the received single-crystal SiC ingot between the ingot grinding unit 4, the ingot cleaning unit 46, the laser applying unit 6, and the wafer peeling unit 8, receiving the SiC wafer peeled off from the single-crystal SiC ingot from the wafer peeling unit 8, and delivering the received SiC wafer successively to the wafer grinding unit 114, the wafer cleaning unit 116, and the first delivery unit 128.

As depicted in FIG. 9, the first delivery unit 128 includes a guide mechanism 132 extending in the X-axis direction along the ingot housing unit 122 and the wafer housing unit 10, a movable block 134 movably mounted on the guide mechanism 132 for movement in the X-axis direction or the opposite direction, and X-axis moving means, not depicted, for moving the movable block 134 in the X-axis direction or the opposite direction. The guide mechanism 132 has a pair of end guide members 136, each in the shape of a rectangular parallelepiped, having respective straight guide grooves 136a defined in upper ends thereof and having terminated ends, and a pair of intermediate guide members 138, each in the shape of a rectangular parallelepiped, having respective straight endless guide grooves 138a defined in upper ends thereof. The guide mechanism 132 can change its own length by changing the number of intermediate guide members 138 used. According to the present embodiment, as depicted in FIG. 9, the guide mechanism 132 has two end guide members 136 and two intermediate guide members 138 that are disposed between the end guide members 136. The end guide members 136 and the intermediate guide members 138 are arranged such that the guide grooves 136a in the end guide members 136 and the guide grooves 138a in the intermediate guide members 138 extend continuously straight in the X-axis direction.

The end guide members 136 and the intermediate guide members 138 have respective circular openings 136b and 138b defined in side surfaces thereof for accommodating electric wires and pipes, not depicted, therein. The movable block 134 has a guided member, not depicted, on its lower surface which movably engages in the guide grooves 136a and 138a of the guide mechanism 132. Since the guided member of the movable block 134 movably engages in the guide grooves 136a and 138a of the guide mechanism 132, the movable block 134 is movably mounted on the guide mechanism 132 for guided movement in the X-axis direction or the opposite direction. The X-axis moving means may be known linear-motor-type moving means, for example, which can easily adapt itself to the length of the guide mechanism 132 that has been adjusted by increasing or reducing the number of intermediate guide members 138 used. In other words, even if the length of the guide mechanism 132 is changed, the X-axis moving means can move the movable block 134 from one end to the other of the guide mechanism 132.

The first delivery unit 128 will further be described below with reference to FIG. 9. A multi-joint arm 140 is mounted on an upper surface of the movable block 134. The multi-joint arm 140 has a distal end on which there is vertically reversibly mounted a suction member 142 having a bifurcated distal end. The multi-joint arm 140, which is actuated by an air actuator, not depicted, or an electric actuator, not depicted, moves the suction member 142 in each direction of the X-axis direction, the Y-axis direction, and the Z-axis direction or its opposite direction, and vertically reverses the suction member 142. The suction member 142 has a plurality of suction holes 142a defined in one surface thereof that are connected to suction means, not depicted, through a fluid channel, not depicted. The first delivery unit 128 operates as follows. When the suction means generates a suction force on the surface of the suction member 142 through the suction holes 142a, the suction member 142 attracts and holds under suction a single-crystal SiC ingot housed in the ingot housing unit 122 or an SiC wafer peeled off from a single-crystal SiC ingot. When the multi-joint arm 140 is actuated, the suction member 142 unloads the single-crystal SiC ingot held thereon from the ingot housing unit 122 or houses the SiC wafer held thereon into the wafer housing unit 10.

Figure 10:
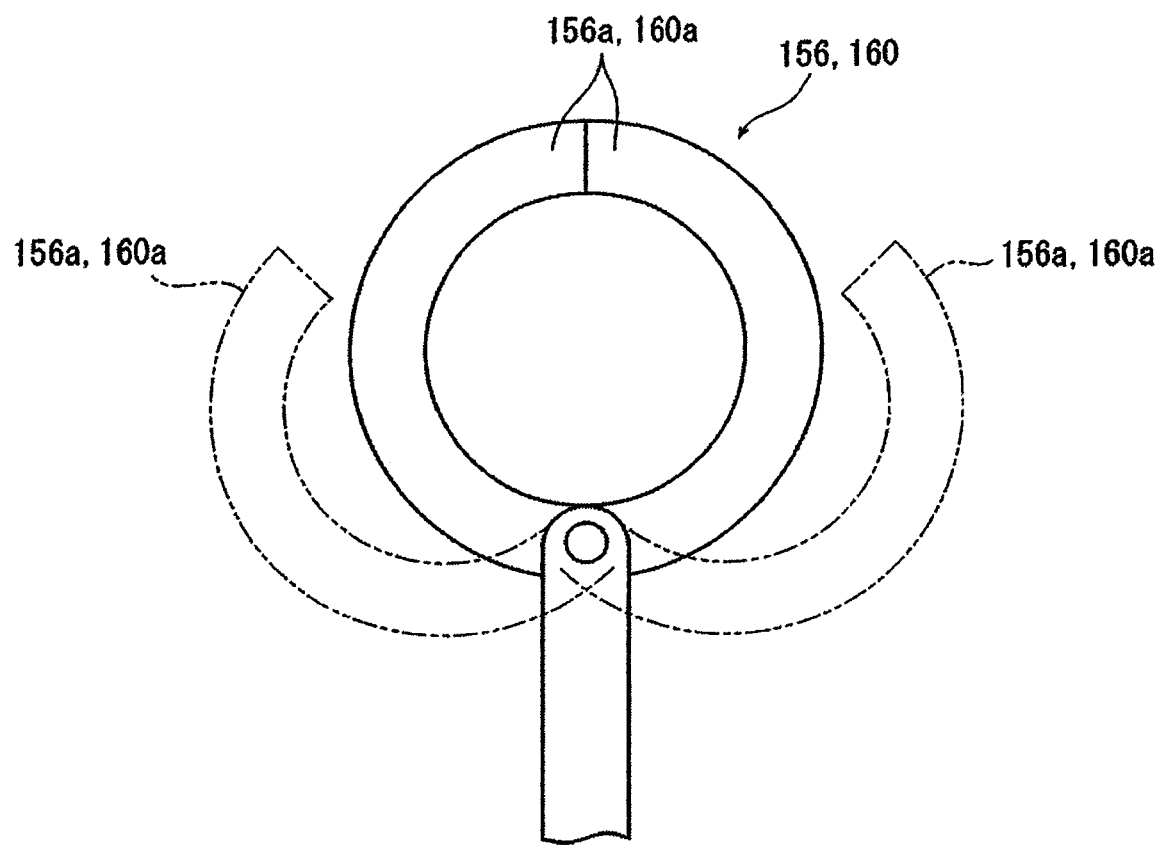
FIG. 10 is an enlarged plan view of first and second grippers of the delivery unit assembly depicted in FIG. 9.

The second delivery unit 130 of the delivery unit assembly 12 will be described below with reference to FIGS. 1, 9, and 10 or mainly FIG. 9. The second delivery unit 130 includes a guide mechanism 144 extending in the Y-axis direction along the ingot grinding unit 4, the ingot cleaning unit 46, the laser applying unit 6, the wafer peeling unit 8, the wafer grinding unit 114, and the wafer cleaning unit 116, a movable block 146 movably mounted on the guide mechanism 144 for movement in the Y-axis direction or the opposite direction, and Y-axis moving means, not depicted, for moving the movable block 146 in the Y-axis direction or the opposite direction. The guide mechanism 144 has a pair of end guide members 148, each in the shape of a rectangular parallelepiped, having respective straight guide grooves 148a defined in upper ends thereof and having terminated ends, and a plurality of intermediate guide members 150, each in the shape of a rectangular parallelepiped, having respective straight endless guide grooves 150a defined in upper ends thereof. The guide mechanism 144 can change its own length by changing the number of intermediate guide members 150 used. According to the present embodiment, as depicted in FIG. 9, the guide mechanism 144 has two end guide members 148 and three intermediate guide members 150 that are disposed between the end guide members 148. The end guide members 148 and the intermediate guide members 150 are arranged such that the guide grooves 148a in the end guide members 148 and the guide grooves 150a in the intermediate guide members 150 extend continuously straight in the Y-axis direction.

The end guide members 148 and the intermediate guide members 150 have respective circular openings 148b and 150b defined in side surfaces thereof for accommodating electric wires and pipes, not depicted, therein. The movable block 146 has a guided member, not depicted, on its lower surface which movably engages in the guide grooves 148a and 150a of the guide mechanism 144. Since the guided member of the movable block 146 movably engages in the guide grooves 148a and 150a of the guide mechanism 144, the movable block 146 is movably mounted on the guide mechanism 144 for guided movement in the Y-axis direction or the opposite direction. The Y-axis moving means may be known linear-motor-type moving means, for example, which can easily adapt itself to the length of the guide mechanism 144 that has been adjusted by increasing or reducing the number of intermediate guide members 150 used. In other words, even if the length of the guide mechanism 144 is changed, the Y-axis moving means can move the movable block 146 from one end to the other of the guide mechanism 144.

The second delivery unit 130 will further be described below with reference to FIG. 9. A multi-joint arm 152 is mounted on an upper surface of the movable block 146. The multi-joint arm 152 has a distal end on which there are mounted a first suction member 154, a first grip member 156, a second suction member 158, and a second grip member 160 that are angularly spaced at circumferential intervals and extend radially outwardly. The first suction member 154 that has a bifurcated distal end and the second suction member 158 that is of a disk shape are each vertically reversibly mounted on the distal end of the multi-joint arm 152. The first grip member 156 and the second grip member 160 each have a pair of semiannular grippers 156a and 160a mounted on the distal end of the multi-joint arm 152 for selective movement between a gripping position, indicated by the solid lines in FIG. 10, where they grip a circumferential surface of a single-crystal SiC ingot, and a releasing position, indicated by the two-dot-and-dash lines in FIG. 10, where they release a single-crystal SiC ingot. The multi-joint arm 152, which is actuated by an air actuator, not depicted, or an electric actuator, not depicted, moves the first suction member 154, the first grip member 156, the second suction member 158, and the second grip member 160 in each direction of the X-axis direction, the Y-axis direction, and the Z-axis direction or its opposite direction, and vertically reverses the first suction member 154 and the second suction member 158 and moves the first grip member 156 and the second grip member 160 between the gripping position and the releasing position. The first suction member 154 has a plurality of suction holes 154a defined in one surface thereof and the second suction member 158 has a plurality of suction holes 158a defined in one surface thereof, and these suction holes 154a and 158a are connected to suction means, not depicted, through a fluid channel, not depicted.

The second delivery unit 130 operates as follows. The first grip member 156 or the second grip member 160 grips the circumferential surface of a single-crystal SiC ingot unloaded from the ingot housing unit 122 by the first delivery unit 128, thereby receiving the unloaded single-crystal SiC ingot. When the multi-joint arm 152 is actuated, it delivers the single-crystal SiC ingot gripped by the first grip member 156 or the second grip member 160 between the ingot grinding unit 4, the ingot cleaning unit 46, the laser applying unit 6, and the wafer peeling unit 8. Since the first grip member 156 or the second grip member 160 grips the circumferential surface of the single-crystal SiC ingot, in delivering the single-crystal SiC ingot with a peel-off layer formed therein, the single-crystal SiC ingot is prevented from being separated from the peel-off layer that serves as a severance initiating point. When a suction force generated by the suction means acts through the suction holes 154a on the surface of the first suction member 154 or through the suction holes 158a on the surface of the second suction member 158, the first suction member 154 or the second suction member 158 attracts and receives an SiC wafer peeled off from the single-crystal SiC ingot under suction on the surface thereof by the wafer peeling unit 8. When the multi-joint arm 152 is actuated, it delivers the SiC wafer attracted and received by the first suction member 154 or the second suction member 158 successively to the wafer grinding unit 114, the wafer cleaning unit 116, and the first delivery unit 128.

The first grip member 156 and the second grip member 160 of the second delivery unit 130 are selectively used depending on whether ground-off chips or the like are deposited on a single-crystal SiC ingot to be gripped thereby or not. For example, when a single-crystal SiC ingot with ground-off chips deposited thereon, which have been produced when the single-crystal SiC ingot was ground by the ingot grinding unit 4, is to be delivered from the ingot grinding unit 4 to the ingot cleaning unit 46, one of the first grip member 156 and the second grip member 160 is used to grip the single-crystal SiC ingot. When the single-crystal SiC ingot from which the ground-off chips have been removed by being cleaned by the ingot cleaning unit 46 is to be delivered from the ingot cleaning unit 46 to the laser applying unit 6, the other of the first grip member 156 and the second grip member 160 is used to grip the single-crystal SiC ingot. In this manner, the first grip member 156 and the second grip member 160 are selectively used. Ground-off chips or the like are thus prevented from being deposited on a grip member that is used to deliver a single-crystal SiC ingot to a unit such as the laser applying unit 6 or the like that should not be contaminated, and hence ground-off chips or the like are prevented from being introduced in to a unit that should not be contaminated. The first suction member 154 and the second suction member 158 of the second delivery unit 130 may similarly be selectively used depending on whether ground-off chips or the like are deposited on an SiC wafer or not.

For example, when an SiC wafer with ground-off chips deposited thereon, which have been produced when the SiC wafer was ground by the wafer grinding unit 114, is to be delivered from the wafer grinding unit 114 to the wafer cleaning unit 116, one of the first suction member 154 and the second suction member 158 is used to attract and hold the SiC wafer. When the SiC wafer from which the ground-off chips have been removed by being cleaned by the wafer cleaning unit 116 is to be delivered from the wafer cleaning unit 116 to the first delivery unit 128, the other of the first suction member 154 and the second suction member 158 is used to attract and hold the SiC wafer. In this manner, the first suction member 154 and the second suction member 158 are selectively used. Ground-off chips or the like are thus prevented from being deposited on a suction member that is used to deliver a cleaned SiC wafer. Therefore, ground-off chips or the like are prevented from being deposited again on a cleaned SiC wafer. The guide mechanisms, the movable blocks, and the moving means, i.e., the Y-axis moving means and the X-axis moving means, of the first delivery unit 128 and the second delivery unit 130 may be made up of common components that can be shared thereby though they are denoted by different reference symbols in the illustrated embodiment because of the different layouts of the guide mechanisms, the different numbers of the intermediate guide members used, and so forth.

According to the present embodiment, the ingot grinding unit 4, the ingot cleaning unit 46, the laser applying unit 6, the wafer peeling unit 8, the wafer grinding unit 114, the wafer cleaning unit 116, and the first delivery unit 128 and the second delivery unit 130 of the delivery unit assembly 12 have respective control means or controllers for controlling their own operation. Each of the control means, which includes a computer, includes a central processing unit (CPU) that performs arithmetic operations according to control programs, a read-only memory (ROM) for storing the control programs, etc., and a read/write random access memory (RAM) for storing the results of the arithmetic operations, etc.

The wafer producing apparatus 2 should preferably include a control unit 162 that is electrically connected to the control means described above. According to the present embodiment, as depicted in FIG. 1, the control unit 162 is disposed in facing relation to the ingot grinding unit 4 across the second delivery unit 130 of the delivery unit assembly 12. The control unit 162, which includes a computer, includes a CPU that performs arithmetic operations according to control programs, a ROM for storing the control programs, etc., and a read/write RAM for storing the results of the arithmetic operations, etc. The control unit 162 outputs to the above control means control signals about details of operation sequences to be carried out by the ingot grinding unit 4, the ingot cleaning unit 46, the laser applying unit 6, the wafer peeling unit 8, the wafer grinding unit 114, the wafer cleaning unit 116, and the first delivery unit 128 and the second delivery unit 130 of the delivery unit assembly 12. According to the present embodiment, as described above, though the various units except the control unit 162 are electrically connected to the control unit 162, since the units are arranged independently of each other, the number of units used can be changed according to the demand of the user.

Figure 11A:
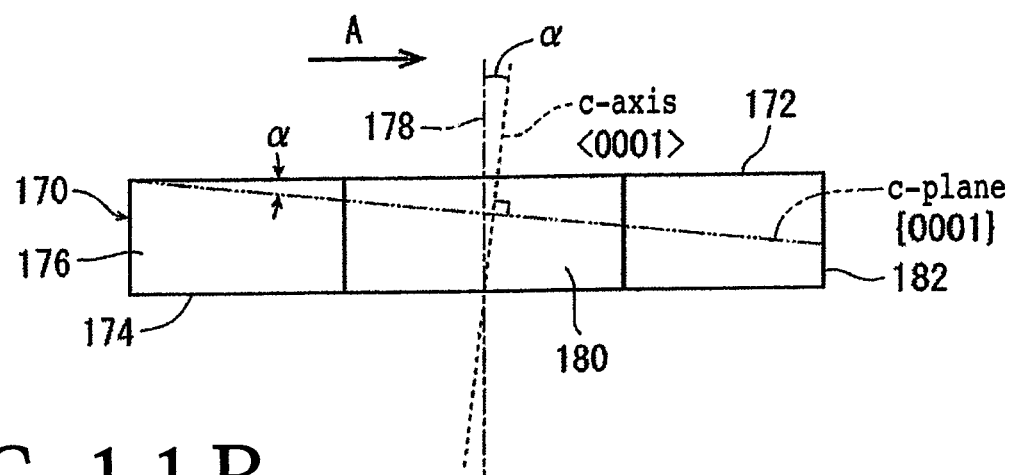
FIG. 11A is a front elevational view of a single-crystal SiC ingot.
Figure 11B:
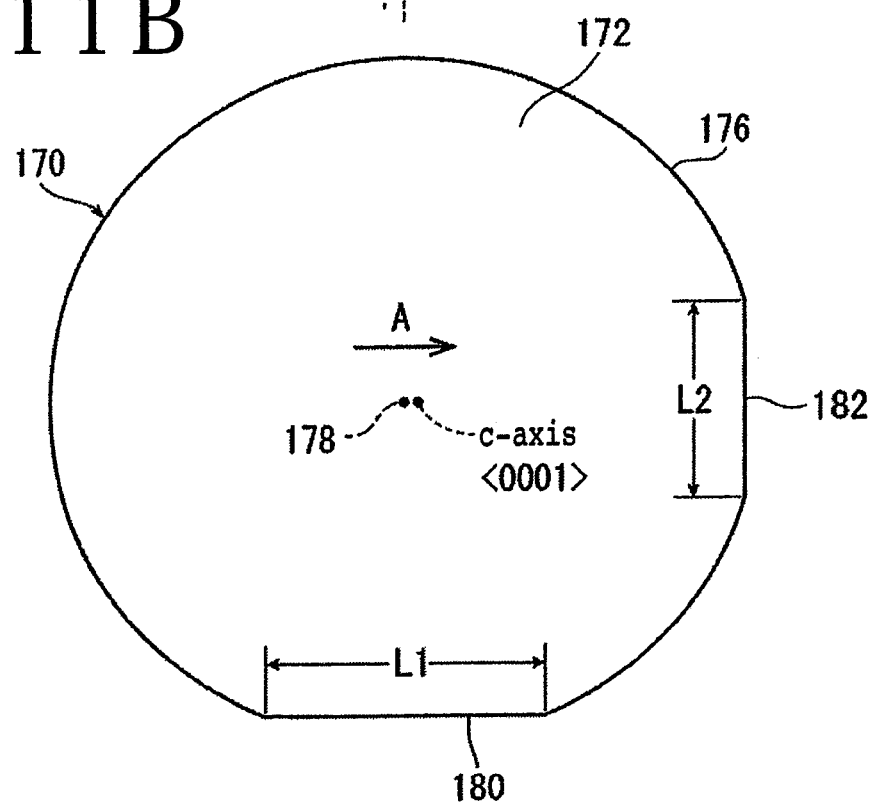
FIG. 11B is a plan view of the single-crystal SiC ingot.

FIGS. 11A and 11B depict a single-crystal SiC ingot 170 that can be processed by the wafer producing apparatus 2. As depicted in FIGS. 11A and 11B, the single-crystal SiC ingot 170 is made of hexagonal single-crystal SiC and has a cylindrical shape as a whole. The single-crystal SiC ingot 170 has a circular first face 172, a circular second face 174 opposite the first face 172, a peripheral face 176 positioned between the first face 172 and the second face 174, a c-axis (<0001> direction) extending from the first face 172 to the second face 174, and a c-plane ({0001} plane) perpendicular to the c-axis. The c-axis is inclined to a line 178 normal to the first face 172, and the c-plane and the first face 172 form an off-angle $\alpha$ (e.g., $\alpha$=1, 3, or 6 degrees) therebetween. The direction in which the off-angle $\alpha$ is formed is indicated by the arrow A in FIGS. 11A and 11B. The peripheral face 176 of the single-crystal SiC ingot 170 has a first orientation flat 180 and a second orientation flat 182, each of a rectangular shape, for indicating a crystal orientation. The first orientation flat 180 lies parallel to the direction A in which the off-angle $\alpha$ is formed, whereas the second orientation flat 182 lies perpendicularly to the direction A in which the off-angle $\alpha$ is formed. As depicted in FIG. 11B, the length L2 of the second orientation flat 182 is smaller than the length L1 of the first orientation flat 180, as viewed from above (L2<L1). The single-crystal SiC ingot that can be processed by the wafer producing apparatus 2 is not limited to the above single-crystal SiC ingot 170, but may be a single-crystal SiC ingot where the c-axis is not inclined to the line normal to the first face and the off-angle between the c-plane and the first face is 0 degree (that is, the line normal to the first face and the c-axis coincide with each other) or a single-crystal GaN ingot made of a material other than single-crystal SiC, such as GaN (gallium nitride) or the like.

Figure 12A:
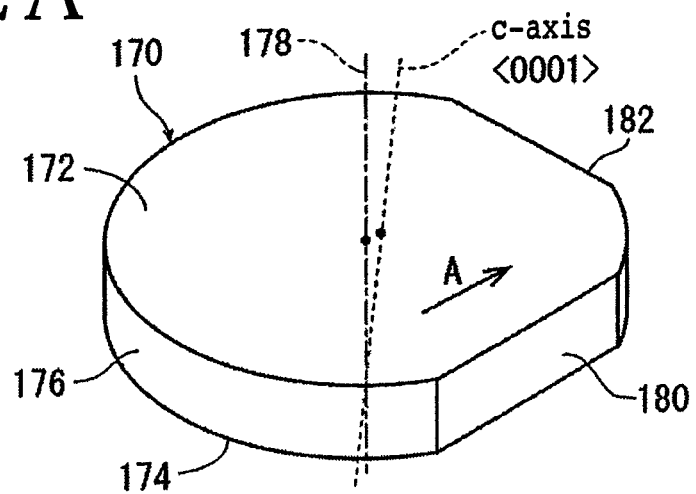
FIG. 12A is a perspective view of the single-crystal SiC ingot and a substrate.
Figure 12A:
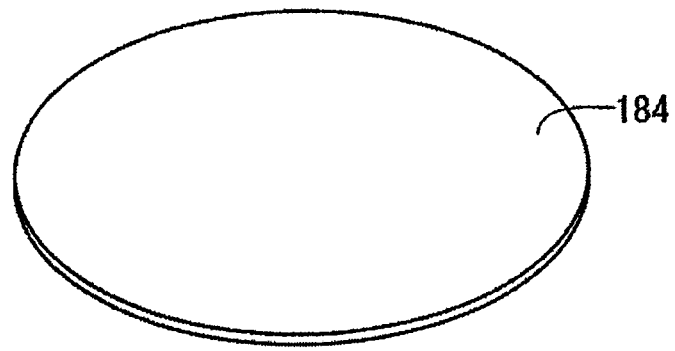
Figure 12B:
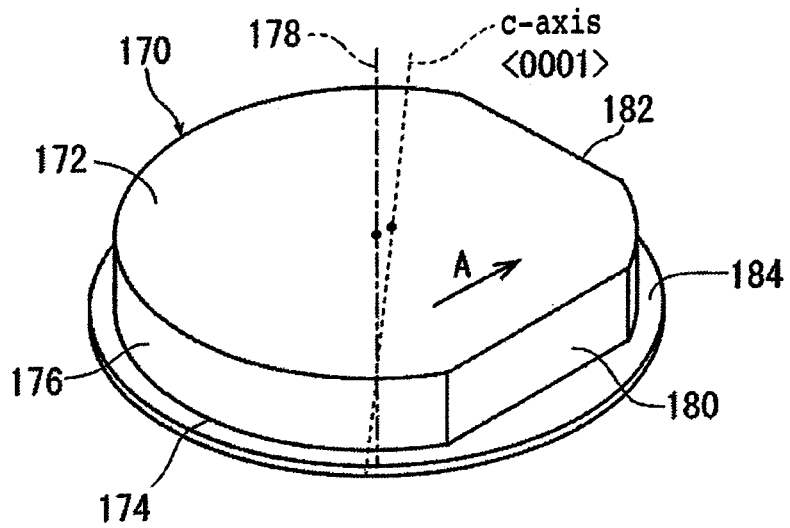
FIG. 12B is a perspective view of the single-crystal SiC ingot with the substrate mounted thereon.

For producing an SiC wafer from the single-crystal SiC ingot 170 with the wafer producing apparatus 2, there is initially performed a substrate mounting step in which a plurality of single-crystal SiC ingots 170 are prepared, and, as depicted in FIGS. 12A and 12B, a disk-shaped substrate 184 is mounted on an end face (the second face 174 according to the present embodiment) of each of the single-crystal SiC ingots 170 by an appropriate adhesive. The substrate mounting step is performed in order to attract and hold under a predetermined suction force the single-crystal SiC ingot 170 where the first orientation flat 180 and the second orientation flat 182 are formed thereon, with the suction chuck of each unit, e.g., the suction chuck 22 of the first holding table 14, etc. The diameter of the substrate 184 is slightly larger than the diameter of the single-crystal SiC ingot 170 and slightly larger than the diameter of the suction chuck of each unit. When the single-crystal SiC ingot 170 with the substrate 184 facing downwardly is placed on the suction chuck, the suction chuck is covered by the substrate 184. Therefore, when the suction means connected to the suction chuck is actuated, the suction chuck attracts the substrate 184 under a predetermined suction force, thereby holding the single-crystal SiC ingot 170 with the first orientation flat 180 and the second orientation flat 182 formed thereon. If the diameter of the single-crystal SiC ingot is larger than the diameter of the suction chuck and hence the entire upper surface of the suction chuck is covered by the single-crystal SiC ingot when the single-crystal SiC ingot is placed on the suction chuck, then since the suction chuck has no exposed upper surface area outside of the single-crystal SiC ingot, no air is drawn into the suction chuck when the suction chuck attracts the single-crystal SiC ingot under suction. As a result, the suction chuck can attract the single-crystal SiC ingot under a predetermined suction force. In this case, the substrate mounting step may be dispensed with.

The substrate mounting step is followed by a preparation step in which the single-crystal SiC ingot with the substrate 184 mounted thereon is housed in the ingot cassette 126 with the substrate 184 facing downwardly, the ingot cassette 126 is placed on the upper surface of the ingot cassette table 124, and empty wafer cassettes 120 are placed on the upper surfaces of the respective wafer cassette tables 118.

The preparation step is followed by an input step in which the operator enters the kind of the single-crystal SiC ingot 170 housed in the ingot cassette 126 into the control unit 162, and enters a processing start command into the control unit 162, using input means, not depicted, of the control unit 162. When the input step is carried out, the control unit 162 outputs processing command signals according to entered processing conditions to the control means of the respective units, and the wafer producing apparatus 2 starts a processing operation.

In the processing operation of the wafer producing apparatus 2, the delivery unit assembly 12 carries out a first ingot delivery step in which it delivers a single-crystal SiC ingot 170 from the ingot housing unit 122 to the laser applying unit 6. Usually, single-crystal SiC ingots 170 have their end faces, i.e., the first face 172 and the second face 174, planarized to the extent that they will not obstruct the application of a laser beam in a subsequent peel-off layer forming step. According to the present embodiment, therefore, it is assumed that the single-crystal SiC ingot 170 is to be delivered from the ingot housing unit 122 to the laser applying unit 6 in the first ingot delivery step. In the first ingot delivery step, the X-axis moving means of the first delivery unit 128 adjusts the position of the movable block 134 to a position in which a single-crystal SiC ingot 170 housed in the ingot cassette 126 can be unloaded by the multi-joint arm 140 of the first delivery unit 128, e.g., a position in which the ingot cassette 126 and the movable block 134 are aligned with each other in the Y-axis direction. Then, the multi-joint arm 140 is actuated to bring the surface of the suction member 142 in which the suction holes 142a are defined into intimate contact with the substrate 184 on the single-crystal SiC ingot 170 housed in the ingot cassette 126. The suction means connected to the suction member 142 is actuated to generate a suction force on the suction member 142, enabling the suction member 142 to attract and hold under suction the single-crystal SiC ingot 170 from the substrate 184 side. Then, the multi-joint arm 140 moves the suction member 142 that is holding the single-crystal SiC ingot 170 from the substrate 184 side thereby to unload the single-crystal SiC ingot 170 from the ingot cassette 126.

Then, the X-axis moving means of the first delivery unit 128 moves the movable block 134 to a position in which the single-crystal SiC ingot 170 can be transferred between the first delivery unit 128 and the second delivery unit 130, e.g., a position in which the movable block 134 of the first delivery unit 128 and the second delivery unit 130 are aligned with each other in the Y-axis direction. At this time, the movable block 146 of the second delivery unit 130 has been put in the position in which the single-crystal SiC ingot 170 can be transferred between the first delivery unit 128 and the second delivery unit 130, e.g., at an end of the guide mechanism 144 of the second delivery unit 130. Then, the multi-joint arm 140 of the first delivery unit 128 is actuated, and the multi-joint arm 152 of the second delivery unit 130 is actuated to cause the first grip member 156 to grip the single-crystal SiC ingot 170 from the peripheral face 176 thereof. Then, the suction means connected to the suction member 142 of the first delivery unit 128 is inactivated to cancel the suction force applied to the suction member 142 of the first delivery unit 128. The single-crystal SiC ingot 170 is now transferred from the first delivery unit 128 to the second delivery unit 130.

Figure 13:
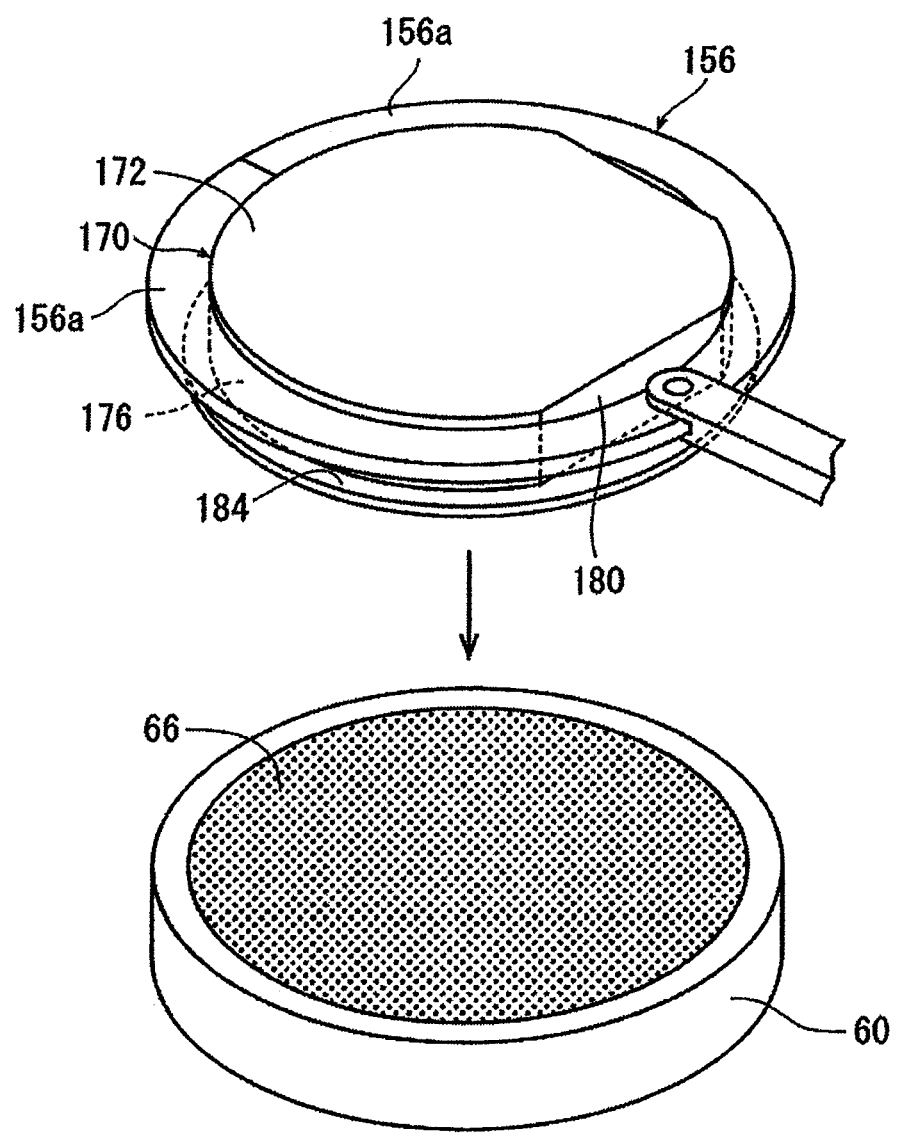
FIG. 13 is a perspective view depicting the manner in which the single-crystal SiC ingot is delivered to the laser applying unit.

Thereafter, the Y-axis moving means of the second delivery unit 130 moves the movable block 146 to a position in which the single-crystal SiC ingot 170 can be transferred between the second delivery unit 130 and the laser applying unit 6, e.g., a position in which the movable block 146 of the second delivery unit 130 and the laser applying unit 6 are aligned with each other in the X-axis direction. Then, the multi-joint arm 152 of the second delivery unit 130 is actuated to bring the substrate 184 into contact with the upper surface of the second holding table 60 of the laser applying unit 6, as depicted in FIG. 13. At this time, the second holding table 60 has been put in an ingot loading/unloading position depicted in FIG. 5 where a single-crystal SiC ingot can be loaded or unloaded. Then, the first grip member 156 releases the single-crystal SiC ingot 170, which is placed onto the upper surface of the second holding table 60 of the laser applying unit 6. In this manner, the single-crystal SiC ingot 170 is delivered from the ingot housing unit 122 to the laser applying unit 6.

After the first ingot delivery step has been carried out, the laser applying unit 6 performs a peel-off layer forming step in which the second holding table 60 of the layer applying unit 6 holds the single-crystal SiC ingot 170 thereon, and the laser applying unit 6 applies a laser beam, which has a wavelength that is transmittable through single-crystal SiC ingot 170, to the single-crystal SiC ingot 170 held on the second holding table 60 while positioning a focal point of the laser beam in the single-crystal SiC ingot 170 at a depth corresponding to the thickness of an SiC wafer to be produced, from the upper surface of the single-crystal SiC ingot 170 on the second holding table 60, thereby forming a peel-off layer in the single-crystal SiC ingot 170. In the peel-off layer forming step, the suction means connected to the suction chuck 66 of the second holding table 60 is actuated to generate a suction force on the upper surface of the suction chuck 66, enabling the second holding table 60 to attract and hold under suction the single-crystal SiC ingot 170 from the substrate 184 side. Then, the X-axis moving means moves the second holding table 60 in the X-axis direction and the Y-axis moving means moves the Y-axis movable member in the Y-axis direction to position the single-crystal SiC ingot 170 below the alignment means 76. The alignment means 76 captures an image of the single-crystal SiC ingot 170 from above the single-crystal SiC ingot 170. Then, based on the captured image of the single-crystal SiC ingot 170, the second holding table electric motor and the X-axis moving means rotate and move the second holding table 60, and the Y-axis moving means moves the Y-axis movable member to adjust the orientation of the single-crystal SiC ingot 170 to a predetermined orientation and also to adjust the positions of the single-crystal SiC ingot 170 and the beam condenser 74 in the XY plane.

Figure 14A:
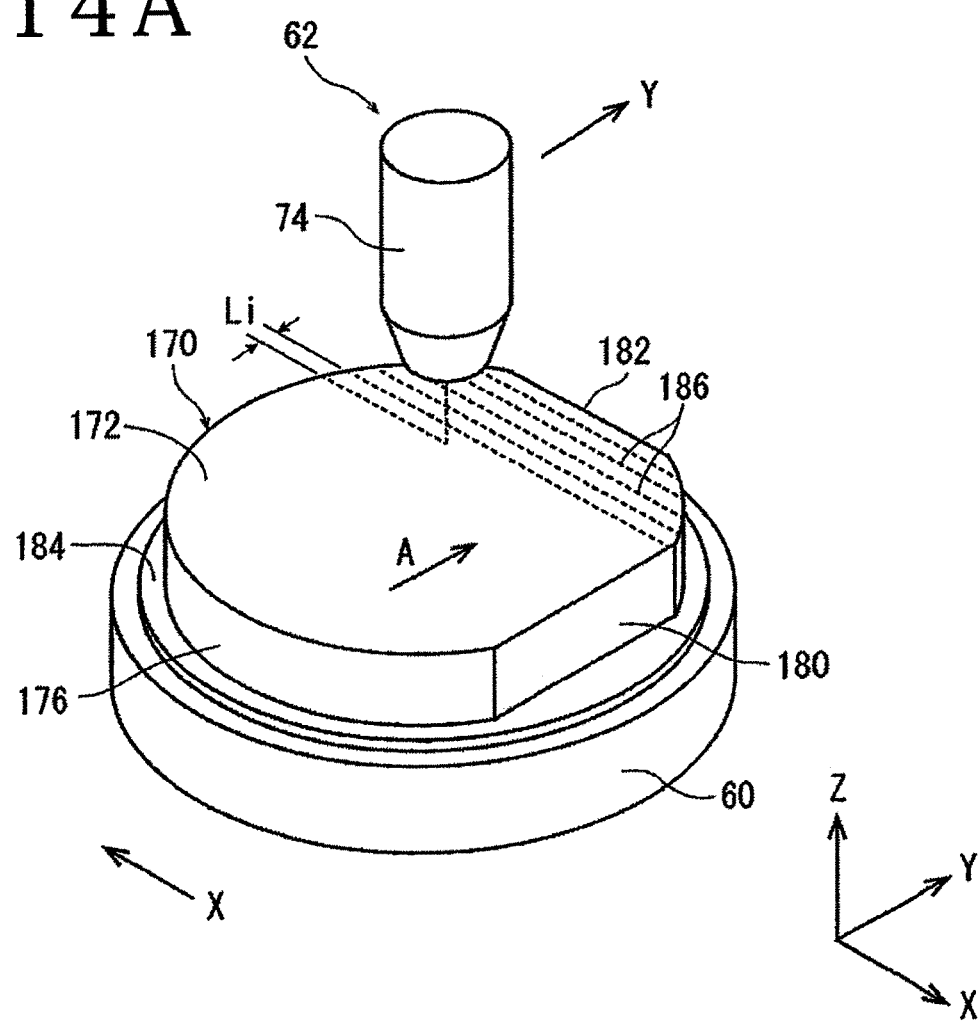
FIG. 14A is a perspective view depicting the manner in which a peel-off layer forming step is carried out on the single-crystal SiC ingot.
Figure 14B:
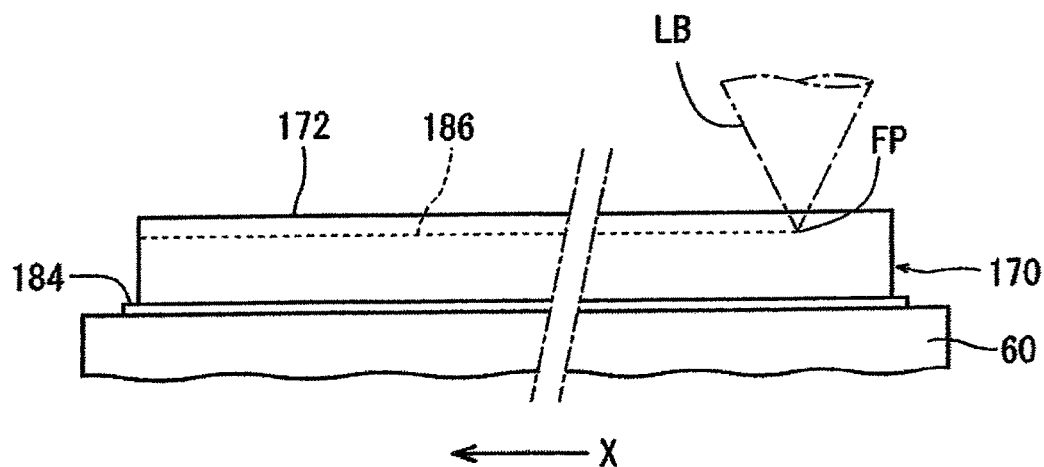
FIG. 14B is a front elevational view depicting the manner in which the peel-off layer forming step is carried out on the single-crystal SiC ingot.

For adjusting the orientation of the single-crystal SiC ingot 170 to a predetermined orientation, as depicted in FIG. 14A, the first orientation flat 180 is directed to face the Y-axis direction and the second orientation flat 182 is directed to face the X-axis direction, thereby bringing the direction A in which the off-angle α is formed into alignment with the Y-axis direction and bringing the direction perpendicular to the direction A in which the off-angle α is formed into alignment with the X-axis direction. Then, the focal point position adjusting means moves the beam condenser 74 in the Z-axis direction or the opposite direction to position a focal point FP in the single-crystal SiC ingot 170 at a depth corresponding to the thickness of an SiC wafer to be produced, from the upper surface, i.e., the first face 172 in the present embodiment, of the single-crystal SiC ingot 170, as depicted in FIG. 14B. Then, while the X-axis moving means is moving the second holding table 60 thereby to move the single-crystal SiC ingot 170 at a predetermined feed speed relatively to the focal point FP in the direction indicated by the arrow X, which is aligned with the direction perpendicular to the direction A in which the off-angle α is formed, a peel-off layer forming process is carried out to apply a pulsed laser beam LB having a wavelength transmittable through the single-crystal SiC ingot 170 from the beam condenser 74 to the single-crystal SiC ingot 170.

Figure 15A:
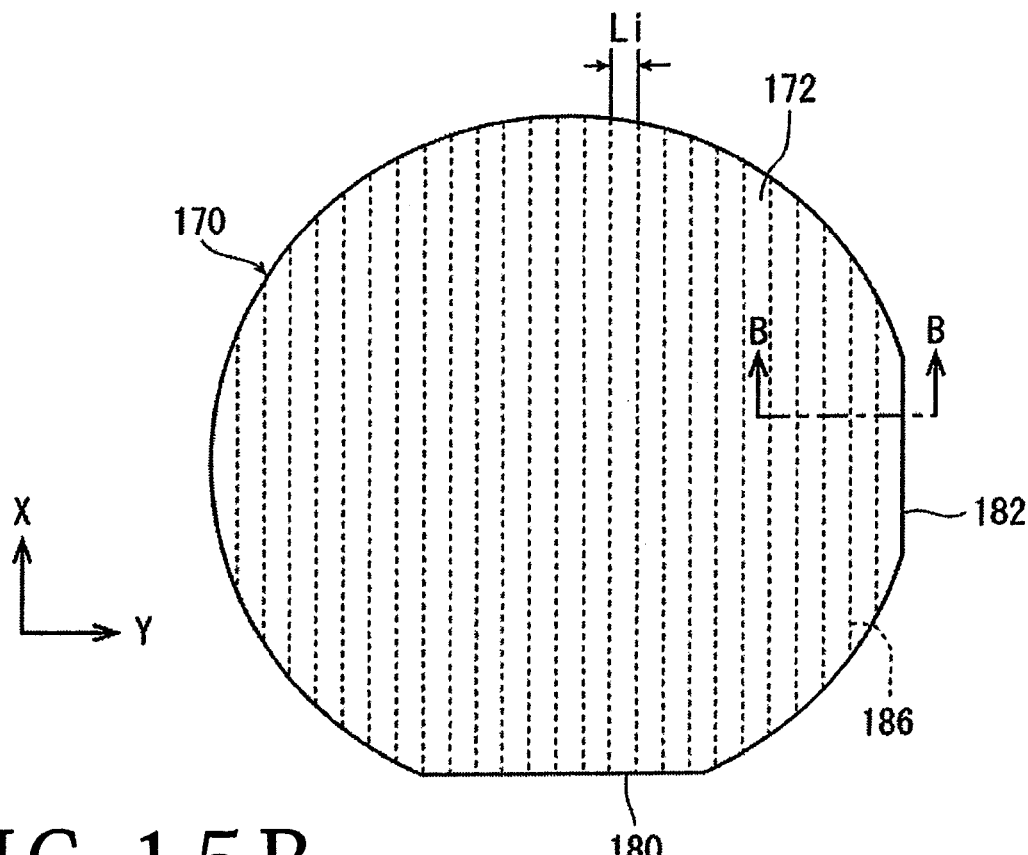
FIG. 15A is a plan view of the single-crystal SiC ingot with peel-off layers formed therein.
Figure 15B:
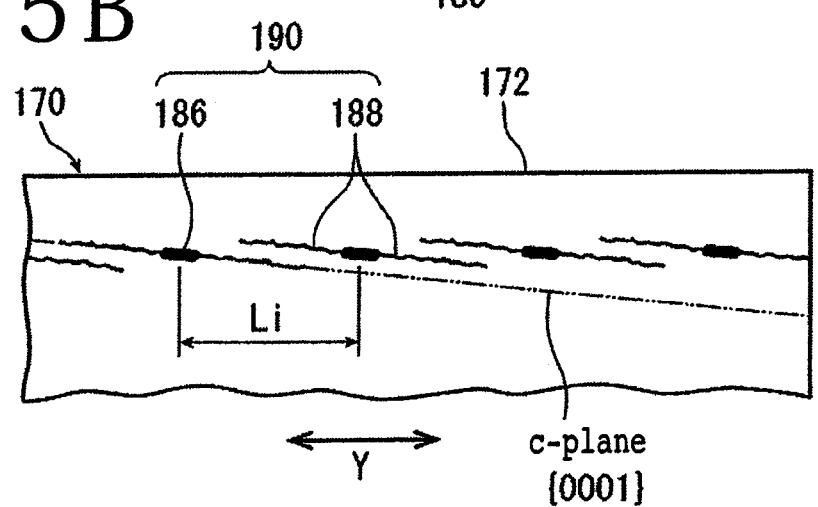
FIG. 15B is a cross-sectional view taken along line B-B of FIG. 15A.

When the peel-off layer forming process is performed, as depicted in FIGS. 15A and 15B, the application of a pulsed laser beam LB to the single-crystal SiC ingot 170 separates SiC into Si (silicon) and C (carbon) in the single-crystal SiC ingot 170, and a pulsed laser beam LB applied next is absorbed by the previously formed C, thereby separating SiC into Si and C in a chain reaction which produce a straight modified layer 186 in the single-crystal SiC ingot 170, with cracks 188 being propagated on both sides of the modified layer 186 along the c-plane from the modified layer 186. In the peel-off layer forming process, the pulsed laser beam LB is applied to the single-crystal SiC ingot 170 while moving or processing-feeding the single-crystal SiC ingot 170 relatively to the focal point FP in the X-axis direction such that adjacent spots of the pulsed laser beam LB overlap each other at the depth where the modified layer 186 is formed, causing the pulsed laser beam LB to be applied again to the modified layer 186 where SiC has been separated into Si and C. In order for adjacent spots of the pulsed laser beam LB to overlap each other, it is required that $G=(V/F)-D$ where F represents the repetitive frequency of the pulsed laser beam LB, V the speed at which the focal point FP is fed, and D the diameter of the spots of the pulsed laser beam LB be G<0. The overlap ratio of the adjacent spots of the pulsed laser beam LB is indicated by |G|/D.

The peel-off layer forming step will further be described below with reference to FIGS. 14A, 14B, 15A, and 15B. In the peel-off layer forming step, after the peel-off layer forming process has been performed, the Y-axis moving means moves the Y-axis movable member to indexing-feed the focal point FP relatively to the single-crystal SiC ingot 170 by a predetermined indexing distance Li in the Y-axis direction that is aligned with the direction A in which the off-angle α is formed. In the peel-off layer forming step, the peel-off layer forming process and the above indexing-feeding process are alternately repeated to form a plurality of straight modified layers 186, each extending in the direction perpendicular to the direction A in which the off-angle α is formed, at spaced intervals each represented by the predetermined indexing distance Li in the direction A in which the off-angle α is formed, and also to cause adjacent cracks 188 in the direction A in which the off-angle α is formed to overlap each other as viewed vertically in FIG. 15B. In this fashion, a peel-off layer 190 made up of a plurality of modified layers 186 and cracks 188 for peeling off an SiC wafer from the single-crystal SiC ingot 170 is formed in the single-crystal SiC ingot 170 at a depth corresponding to the thickness of the SiC wafer to be produced, from the upper surface of the single-crystal SiC ingot 170. After the peel-off layer 190 has been formed, the X-axis moving means moves the second holding table 60 to the ingot loading/unloading position, and the suction means connected to the suction chuck 66 is inactivated to cancel the suction force applied to the suction chuck 66. The peel-off layer forming step for forming the peel-off layer 190 in the single-crystal SiC ingot 170 may be carried out under the following processing conditions, for example:

Wavelength of the pulsed laser beam: 1064 nm
Repetitive frequency thereof: 80 kHz
Average power output thereof: 3.2 W
Pulse duration thereof: 4 ns
Diameter of the focal point thereof: 3 µm
Numerical aperture (NA) of the condensing lens: 0.43
Position of the focal point in the Z-axis direction: 300 µm from the upper surface of the single-crystal SiC ingot
Speed at which the second holding table is fed: 120 to 260 mm/second
Indexing distance: 250 to 400 µm After the peel-off layer forming step has been performed, the second delivery unit 130 of the delivery unit assembly 12 carries out a second ingot delivery step in which it delivers the single-crystal SiC ingot 170 with the peel-off layer 190 formed therein from the laser applying unit 6 to the wafer peeling unit 8. In the second ingot delivery step, the Y-axis moving means of the second delivery unit 130 adjusts the position of the movable block 146 to a position in which the single-crystal SiC ingot 170 can be transferred between the second delivery unit 130 and the laser applying unit 6. Then, the multi-joint arm 152 of the second delivery unit 130 is actuated to cause the first grip member 156 to grip the single-crystal SiC ingot 170, which has been positioned in the ingot loading/unloading position in the laser applying unit 6, from the peripheral face 176. Then, the multi-joint arm 152 moves the first grip member 156 that has gripped the single-crystal SiC ingot 170, and the Y-axis moving means moves the movable block 146 to a position in which the single-crystal SiC ingot 170 can be transferred between the second delivery unit 130 and the wafer peeling unit 8, e.g., a position in which the movable block 146 and the wafer peeling unit 8 are aligned with each other in the X-axis direction, thereby bringing the substrate 184 into contact with the upper surface of the third holding table 80 of the wafer peeling unit 8. At this time, the third holding table 80 has been put in an ingot loading/unloading position depicted in FIG. 7 where a single-crystal SiC ingot 170 can be loaded or unloaded. Then, the first grip member 156 releases the single-crystal SiC ingot 170, which is placed onto the upper surface of the third holding table 80. In this manner, the single-crystal SiC ingot 170 with the peel-off layer 190 formed therein is delivered from the laser applying unit 6 to the wafer peeling unit 8.

Figures 16A, 16B:
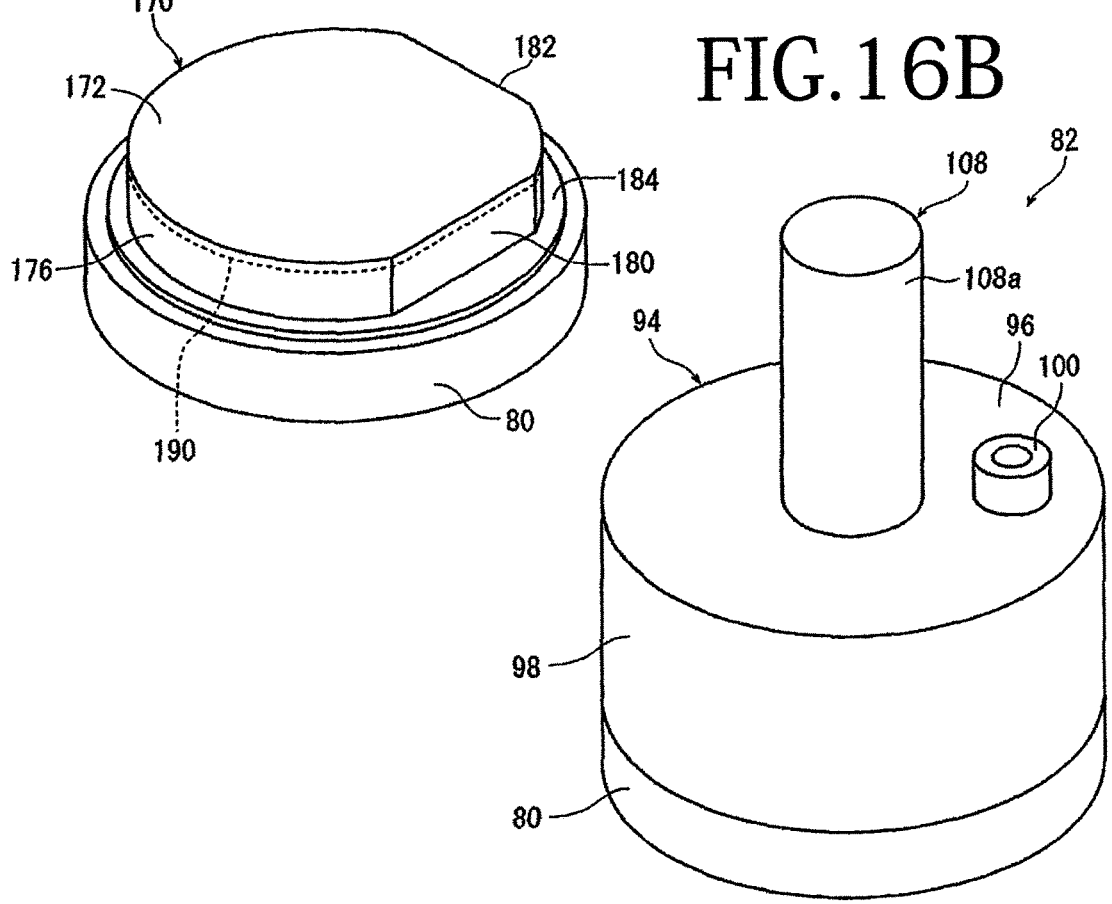
FIG. 16A is a perspective view of a liquid container positioned above a third holding table of the wafer peeling unit.
FIG. 16B is a perspective view of the liquid container whose lower surface is held in contact with an upper surface of the third holding table.

After the second ingot delivery step has been performed, the wafer peeling unit 8 carries out a wafer peeling step in which the single-crystal SiC ingot 170 with the peel-off layer 190 formed therein is held on the third holding table 80, an upper surface of the single-crystal SiC ingot 170 held on the third holding table 80 is held, and an SiC wafer is peeled off the peel-off layer 190. In the wafer peeling step, the suction means connected to the suction chuck 86 of the third holding table 80 is actuated to generate a suction force on the upper surface of the suction chuck 86, enabling the third holding table 80 to attract and hold under suction the single-crystal SiC ingot 170 from the substrate 184 side. Then, as depicted in FIG. 16A, the X-axis moving means lowers the third holding table 80 to a wafer peeling position below the liquid container 94. Then, as depicted in FIG. 16B, the arm moving means lowers the arm 92 to bring the lower end of the side wall 98 of the liquid container 94 into intimate contact with the upper surface of the third holding table 80. Then, as depicted in FIG. 8, the air cylinder 108 is actuated to move the piston rod 108b to bring the lower surface of the suction member 112 into intimate contact with the upper surface (the first face 172 according to the present embodiment) of the single-crystal SiC ingot 170. Then, the suction means connected to the suction member 112 is actuated to generate a suction force on the lower surface of the suction member 112, enabling the suction member 112 to attract and hold under suction the single-crystal SiC ingot 170 from the first face 172 side.

Figure 17:
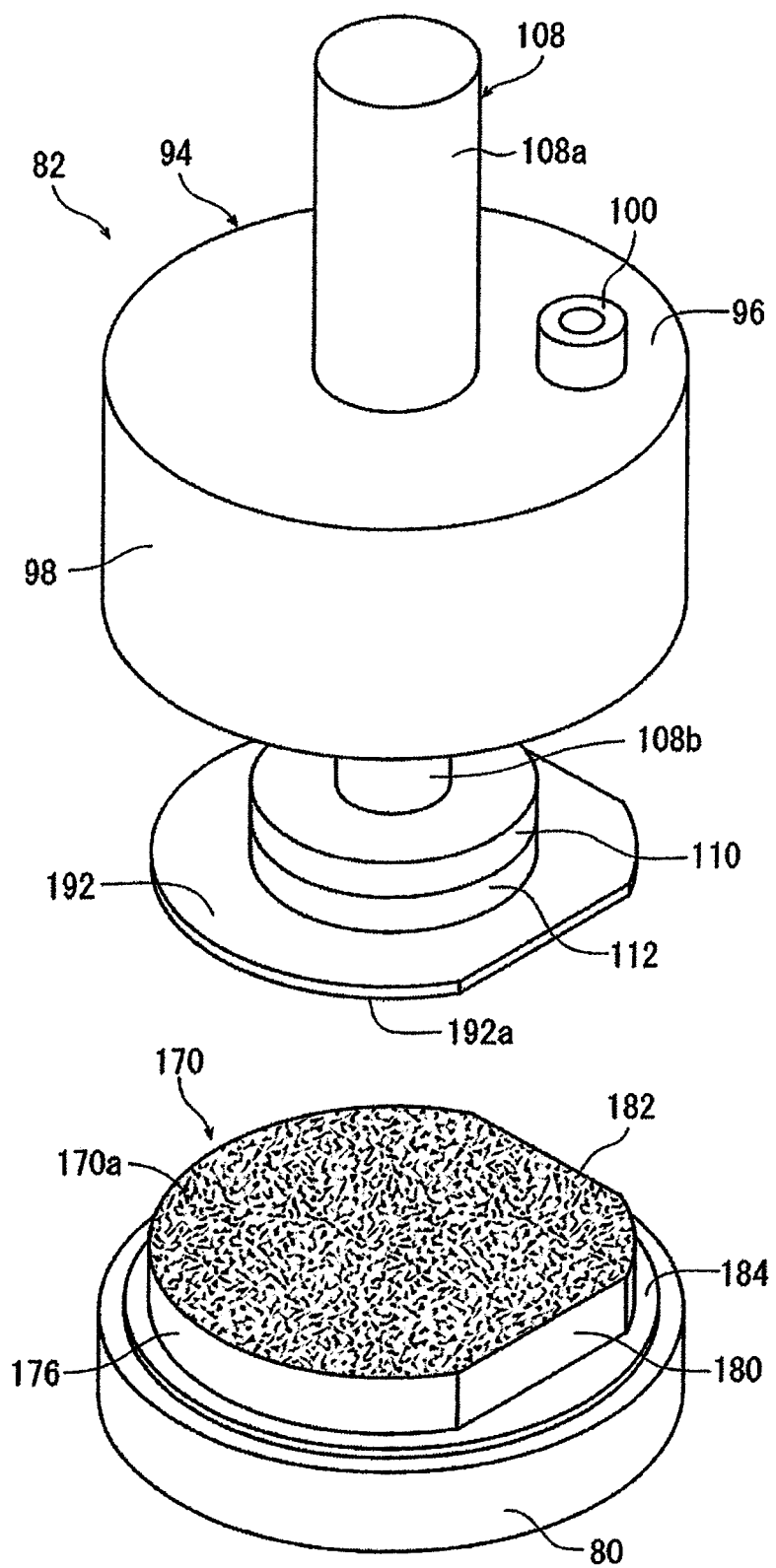
FIG. 17 is a perspective view depicting the manner in which an SiC wafer is peeled off from the single-crystal SiC ingot by the wafer peeling unit.

Then, the liquid supply means connected to the liquid supply port 100 is actuated to supply the liquid 106, e.g., water, from the liquid supply port 100 to the liquid storing space 104 until the ultrasonic vibration generator 110 is immersed in the liquid 106. The ultrasonic vibration generator 110 is energized to apply ultrasonic vibrations to the single-crystal SiC ingot 170, thereby peeling an SiC wafer 192 (see FIG. 17) off the peel-off layer 190 as a severance initiating point from the single-crystal SiC ingot 170. Then, the arm moving means lifts the arm 92, discharging the liquid 106 from the liquid storing space 104. The liquid 106 discharged from the liquid storing space 104 is drained out of the wafer peeling unit 8 through a drain hole, not depicted, defined in the base 84. The air cylinder 108 is actuated to lower the piston rod 108b until the SiC wafer 192 produced from the single-crystal SiC ingot 170 projects downwardly from the lower end of the side wall 98 of the liquid container 94, as depicted in FIG. 17. The single-crystal SiC ingot 170 from which the SiC wafer 192 has been produced has a peeled face 170a from which the SiC wafer 192 has been peeled off, and the SiC wafer 192 has a peeled face 192a which has been detached from the peeled face 170a of the single-crystal SiC ingot 170. These peeled faces 170a and 192a have surface irregularities having a height of approximately 100 µm. The SiC wafer 192 that has been peeled off from the single-crystal SiC ingot 170 has a thickness of approximately 300 µm. After SiC wafer 192 has been peeled off from the single-crystal SiC ingot 170, the X-axis moving means moves the third holding table 80 from the single-crystal SiC ingot 170 to the ingot loading/unloading position, and the suction means connected to the suction chuck 86 is inactivated to cancel the suction force applied to the suction chuck 86.

After the wafer peeling step has been carried out, the second delivery unit 130 performs a third ingot delivery step in which it delivers the single-crystal SiC ingot 170 from which the SiC wafer 192 has been peeled off from the wafer peeling unit 8 to the ingot grinding unit 4, and the second delivery unit 130 performs a first wafer delivery step in which it delivers the SiC wafer 192 that has been peeled off from the single-crystal SiC ingot 170 from the wafer peeling unit 8 to the wafer grinding unit 114. The second delivery unit 130, which performs both the third ingot delivery step and the first wafer delivery step, may perform either one of the third ingot delivery step and the first wafer delivery step earlier than the other.

Various steps, including the third ingot delivery step, to be performed on the single-crystal SiC ingot 170 from which the SiC wafer 192 has been peeled off will first be described below, and various steps, including the first wafer delivery step, to be performed on the SiC wafer 192 that has been peeled off from the single-crystal SiC ingot 170 will then be described below.

In the third ingot delivery step, the Y-axis moving means of the second delivery unit 130 adjusts the position of the movable block 146 to a position in which the single-crystal SiC ingot 170 can be transferred between the second delivery unit 130 and the wafer peeling unit 8. Then, the multi-joint arm 152 of the second delivery unit 130 is actuated to cause the second grip member 160 to grip the single-crystal SiC ingot 170, which has been positioned in the ingot loading/unloading position in the wafer peeling unit 8, from the peripheral face 176. Then, the multi-joint arm 152 moves the second grip member 160 that has gripped the single-crystal SiC ingot 170, and the Y-axis moving means moves the movable block 146 to a position in which the single-crystal SiC ingot 170 can be transferred between the second delivery unit 130 and the ingot grinding unit 4, e.g., a position in which the movable block 146 and the ingot grinding unit 4 are aligned with each other in the X-axis direction, thereby bringing the substrate 184 into contact with the upper surface of the first holding table 14 of the ingot grinding unit 4 placed in the ingot loading/unloading position. Then, the second grip member 160 releases the single-crystal SiC ingot 170, which is placed onto the upper surface of the first holding table 14.

In this manner, the single-crystal SiC ingot 170 from which the SiC wafer 192 has been peeled off is delivered from the wafer peeling unit 8 to the ingot grinding unit 4. In the third ingot delivery step, the second grip member 160 grips the single-crystal SiC ingot 170 for the following reasons. The liquid 106 and peeled-off debris produced when the SiC wafer 192 is peeled off may have been deposited on the single-crystal SiC ingot 170 from which the SiC wafer 192 has been peeled off by the wafer peeling unit 8. In the third ingot delivery step, rather than the first grip member 156 that is used in the first ingot delivery step for delivering the single-crystal SiC ingot 170 to the laser applying unit 6 and the second ingot delivery step for delivering the single-crystal SiC ingot 170 from the laser applying unit 6, the second grip member 160 is used to grip the single-crystal SiC ingot 170. Therefore, the liquid 106 and the peeled-off debris are prevented from being deposited on the first grip member 156 and hence from being introduced into the laser applying unit 6 in the first ingot delivery step and the second ingot delivery step that are repeatedly carried out as described later.

After the third ingot delivery step has been carried out, the ingot grinding unit 4 performs an ingot grinding step in which the single-crystal SiC ingot 170 from which the SiC wafer 192 has been peeled off is held on one of the first holding tables 14 and the upper surface of the single-crystal SiC ingot 170 (the peeled face 170a) held on the first holding table 14 is ground and planarized. The ingot grinding step will be described below with reference to FIG. 3. In the ingot grinding step, the suction means connected to the suction chuck 22 of the first holding table 14 is actuated to generate a suction force on the upper surface of the suction chuck 22, enabling the first holding table 14 to attract and hold under suction the single-crystal SiC ingot 170 from the substrate 184 side. Then, the turntable electric motor turns the turntable 20 about its own axis to position the first holding table 14 that is holding the single-crystal SiC ingot 170 thereon in the grinding position. Then, the first holding table electric motor rotates the first holding table 14 that is holding the single-crystal SiC ingot 170 thereon, about its own axis counterclockwise as viewed from above at a predetermined speed of 300 rpm, for example. The spindle electric motor rotates the spindle 36 about its own axis counterclockwise as viewed from above at a predetermined speed of 6000 rpm, for example. Then, the lifting/lowering electric motors 34 are energized to lower the spindle housing 30 to bring the grinding stones 44 into contact with the peeled face 170a of the single-crystal SiC ingot 170. After having brought the grinding stones 44 into contact with the peeled face 170a, the lifting/lowering electric motors 34 lower the spindle housing 30 at a predetermined grinding feed speed of 1.0 μm/second, for example. The grinding stones 44 thus grind the peeled face 170a of the single-crystal SiC ingot 170 from which the SiC wafer 192 has been peeled off, thereby planarizing the peeled face 170a of the single-crystal SiC ingot 170 to the extent that it will not obstruct the application of the pulsed laser beam LB in the peel-off layer forming step.

After the peeled face 170a of the single-crystal SiC ingot 170 has been planarized, the turntable electric motor turns the turntable 20 to put the first holding table 14 that is holding the single-crystal SiC ingot 170 in the ingot loading/unloading position, and the suction means connected to the suction chuck 22 is inactivated to cancel the suction force applied to the suction chuck 22. When the peeled face 170a of the single-crystal SiC ingot 170 is ground and planarized, a thickness measuring instrument, not depicted, may be brought into contact with the peeled face 170a of the single-crystal SiC ingot 170. If it is detected that the thickness of the single-crystal SiC ingot 170 which is measured by the thickness measuring instrument has been reduced by a predetermined amount, e.g., 100 μm that is as large as the height of the surface irregularities of the peeled face 170a, then it may be decided that the upper surface of the single-crystal SiC ingot 170 has been planarized. In the ingot grinding step, when the peeled face 170a of the single-crystal SiC ingot 170 is ground, grinding water is supplied from grinding water supply means, not depicted, to an area being ground, and the grinding water supplied to the area being ground is discharged out of the ingot grinding unit 4 through a drain hole, not depicted, defined in the base 18.

After the ingot grinding step has been carried out, the second delivery unit 130 performs a fourth ingot delivery step in which it delivers the single-crystal SiC ingot 170 whose upper surface has been planarized from the ingot grinding unit 4 to the ingot cleaning unit 46. In the fourth ingot delivery step, the Y-axis moving means of the second delivery unit 130 adjusts the position of the movable block 146 to a position in which the single-crystal SiC ingot 170 can be transferred between the second delivery unit 130 and the ingot grinding unit 4. Then, the multi-joint arm 152 of the second delivery unit 130 is actuated to cause the second grip member 160 to grip the single-crystal SiC ingot 170, which has been positioned in the ingot loading/unloading position in the ingot grinding unit 4, from the peripheral face 176. Then, the multi-joint arm 152 moves the second grip member 160 that has gripped the single-crystal SiC ingot 170, and the Y-axis moving means moves the movable block 146 to a position in which the single-crystal SiC ingot 170 can be transferred between the second delivery unit 130 and the ingot cleaning unit 46, e.g., a position in which the movable block 146 and the ingot cleaning unit 46 are aligned with each other in the X-axis direction, thereby bringing the substrate 184 into contact with the upper surface of the chuck table 48 of the ingot cleaning unit 46. Then, the second grip member 160 releases the single-crystal SiC ingot 170, which is placed onto the upper surface of the chuck table 48. In this manner, the single-crystal SiC ingot 170 whose upper surface has been planarized is delivered from the ingot grinding unit 4 to the ingot cleaning unit 46.

In the fourth ingot delivery step, the second grip member 160 grips the single-crystal SiC ingot 170 for the following reasons. Ground-off chips and grinding water may have been deposited on the single-crystal SiC ingot 170 whose upper surface has been planarized by the ingot grinding unit 4. In the fourth ingot delivery step, rather than the first grip member 156 that is used in the first ingot delivery step for delivering the single-crystal SiC ingot 170 to the laser applying unit 6 and the second ingot delivery step for delivering the single-crystal SiC ingot 170 from the laser applying unit 6, the second grip member 160 is used to grip the single-crystal SiC ingot 170. Therefore, ground-off chips and grinding water are prevented from being deposited on the first grip member 156 and hence from being introduced into the laser applying unit 6 in the first ingot delivery step and the second ingot delivery step that are repeatedly carried out as described later.

After the fourth ingot delivery step has been carried out, the ingot cleaning unit 46 performs an ingot cleaning step for cleaning the single-crystal SiC ingot 170 whose upper surface has been planarized. In the ingot cleaning step, the suction means connected to the suction chuck 56 of the chuck table 48 is actuated to generate a suction force on the upper surface of the suction chuck 56, enabling the chuck table 48 to attract and hold under suction the single-crystal SiC ingot 170 from the substrate 184 side. Then, the chuck table electric motor rotates the chuck table 48. The pipe 58 is connected to the cleaning water supply source, ejecting cleaning water from the ejection port 58a of the pipe 58 toward the single-crystal SiC ingot 170 held on the chuck table 48. The ejected cleaning water removes ground-off chips, grinding water, etc. deposited on the single-crystal SiC ingot 170, thereby cleaning the single-crystal SiC ingot 170, and the cleaning water is removed from the single-crystal SiC ingot 170 by centrifugal forces generated upon rotation of the chuck table 48. Then, the pipe 58 is connected to the pressurized air source, ejecting drying air from the ejection port 58a of the pipe 58 toward the single-crystal SiC ingot 170 held on the chuck table 48. The ejected drying air removes cleaning water that may have not been removed from the single-crystal SiC ingot 170 by the centrifugal forces generated upon rotation of the chuck table 48, thereby drying the single-crystal SiC ingot 170. After the single-crystal SiC ingot 170 has been cleaned and dried, the suction means connected to the suction chuck 56 is inactivated to cancel the suction force applied to the suction chuck 56.

After the ingot cleaning step has been performed, the second delivery unit 130 performs a fifth ingot delivery step in which it delivers the single-crystal SiC ingot 170 which has been cleaned from the ingot cleaning unit 46 to the laser applying unit 6. In the fifth ingot delivery step, the Y-axis moving means of the second delivery unit 130 adjusts the position of the movable block 146 to a position in which the single-crystal SiC ingot 170 can be transferred between the second delivery unit 130 and the ingot cleaning unit 46. Then, the multi-joint arm 152 of the second delivery unit 130 is actuated to cause the first grip member 156 to grip the single-crystal SiC ingot 170 from the peripheral face 176. Then, the multi-joint arm 152 moves the first grip member 156 that has gripped the single-crystal SiC ingot 170, and the Y-axis moving means moves the movable block 146 to a position in which the single-crystal SiC ingot 170 can be transferred between the second delivery unit 130 and the laser applying unit 6, thereby bringing the substrate 184 into contact with the upper surface of the second holding table 60 of the laser applying unit 6. At this time, the second holding table 60 has been put in the ingot loading/unloading position where a single-crystal SiC ingot can be loaded or unloaded. Then, the first grip member 156 releases the single-crystal SiC ingot 170, which is placed onto the upper surface of the second holding table 60. In this manner, the single-crystal SiC ingot 170 that has been cleaned is delivered from the ingot cleaning unit 46 to the laser applying unit 6. In the fifth ingot delivery step, the first grip member 156 grips the single-crystal SiC ingot 170 for the following reasons. The liquid 106, peeled-off debris, grinding water, ground-off debris, etc. may have been deposited on the second grip member 160 in the third and fourth ingot delivery steps. In the fifth ingot delivery step, rather than the second grip member 160, the first grip member 156 is used to grip the single-crystal SiC ingot 170. Therefore, the liquid 106, etc. are prevented from being introduced into the laser applying unit 6.

After the fifth ingot delivery step has been carried out, the laser applying unit 6 performs the above peel-off layer forming step. Then, the second through fifth ingot delivery steps for delivering the single-crystal SiC ingot 170 between the laser applying unit 6, the wafer peeling unit 8, the ingot grinding unit 4, and the ingot cleaning unit 46 with the second delivery unit 130, the peel-off layer forming step for forming a peel-off layer with the laser applying unit 6, the wafer peeling step for peeling an SiC wafer with the wafer peeling unit 8, the ingot grinding step for grinding a single-crystal SiC ingot with the ingot grinding unit 4, and the ingot cleaning step for cleaning a single-crystal SiC ingot with the ingot cleaning unit 46 are repeatedly carried out to produce as many SiC wafers 192 as can be produced from the single-crystal SiC ingot 170. After the SiC wafers 192 have been produced from the single-crystal SiC ingot 170, the substrate 184 on which a slight amount of the single-crystal SiC ingot stock remains is retrieved by being delivered to a retrieval container, not depicted, by the delivery unit assembly 12. In the second through fifth ingot delivery steps, if the thickness of the single-crystal SiC ingot 170 becomes so small that it is difficult for the first grip member 156 or the second grip member 160 to grip the single-crystal SiC ingot 170 from the peripheral face 176, then the first suction member 154 or the second suction member 158 may attract and hold under suction the single-crystal SiC ingot 170.

The various steps that are carried on the single-crystal SiC ingot 170 by the wafer producing apparatus 2 have been described above particularly with respect to the processing of one single-crystal SiC ingot 170. In the wafer producing apparatus 2, however, after the first ingot delivery step for delivering a single-crystal SiC ingot 170 from the ingot housing unit 122 to the laser applying unit 6 has been carried out, the first ingot delivery step is repeatedly carried out at appropriate time intervals, and the second through fifth ingot delivery steps, the peel-off layer forming step, the wafer peeling step, the ingot grinding step, and the ingot cleaning step are repeatedly performed concurrently on a plurality of single-crystal SiC ingots 170, thereby producing as many SiC wafers 192 as can be produced from those single-crystal SiC ingots 170. In the case where a pair of first holding tables 14 are mounted on the turntable 20 as with the ingot grinding unit 4 according to the present embodiment, when a single-crystal SiC ingot 170 is ground by the grinding means 16, a next single-crystal SiC ingot 170 may be delivered to the first holding table 14 that has been put in the ingot loading/unloading position, thereby making the ingot grinding unit 4 efficient in operation.

Various steps to be carried out on the SiC wafer 192 peeled off from the single-crystal SiC ingot 170 will be described below. After the wafer peeling step has been carried out, the second delivery unit 130 performs the first wafer delivery step in which it delivers the SiC wafer 192 that has been peeled off from the single-crystal SiC ingot 170 from the wafer peeling unit 8 to the wafer grinding unit 114. In the first wafer delivery step, the Y-axis moving means of the second delivery unit 130 adjusts the position of the movable block 146 to a position in which the SiC wafer 192 (see FIG. 17) attracted by the suction member 112 of the wafer peeling unit 8 can be unloaded by the multi-joint arm 152 of the second delivery unit 130, e.g., a position in which the movable block 146 and the wafer peeling unit 8 are aligned with each other in the X-axis direction. Then, the multi-joint arm 152 is actuated to bring one surface (the surface where the suction holes 158a are defined) of the second suction member 158 of the second delivery unit 130 into intimate contact with the peeled face 192a of the SiC wafer 192. Then, the suction means connected to the suction member 112 of the wafer peeling unit 8 is inactivated to cancel the suction force applied to the suction member 112, and the suction means connected to the second suction member 158 of the second delivery unit 130 is actuated to generate a suction force on the second suction member 158, enabling the second suction member 158 to attract and hold under suction the SiC wafer 192 from the peeled face 192a side. The SiC wafer 192 is thus transferred from the wafer peeling unit 8 to the second delivery unit 130.

Then, the multi-joint arm 152 is actuated to vertically reverse the second suction member 158, causing the peeled face 192a attracted by the second suction member 158 to face upwardly. Then, the multi-joint arm 152 is actuated to bring the face of the SiC wafer 192 that is opposite the peeled face 192a thereof into contact with the upper surface of the first holding table 14 that has been put in a wafer loading/unloading position (which is the same as the ingot loading/unloading position (closer to the viewer of FIG. 2) in the ingot grinding unit 4) in the wafer grinding unit 114. According to the present embodiment, since the wafer grinding unit 114 is disposed in facing relation to the wafer peeling unit 8, the Y-axis moving means may not adjust the position of the movable block 146 to a position in which the SiC wafer 192 can be transferred between the second delivery unit 130 and the wafer grinding unit 114, e.g., a position in which the movable block 146 and the wafer grinding unit 114 are aligned with each other in the X-axis direction. However, if the wafer grinding unit 114 is not disposed in facing relation to the wafer peeling unit 8, then the Y-axis moving means may adjust the position of the movable block 146. Thereafter, the suction means connected to the second suction member 158 is inactivated to cancel the suction force applied to the second suction member 158, and the SiC wafer 192 is placed, with the peeled face 192a facing upwardly, on the upper surface of the first holding table 14 of the wafer grinding unit 114. In this manner, the SiC wafer 192 that has been peeled off from the single-crystal SiC ingot 170 is delivered from the wafer peeling unit 8 to the wafer grinding unit 114.

In the first wafer delivery step, the second suction member 158 holds the SiC wafer 192 for the following reasons. The liquid 106 and peeled-off debris produced when the SiC wafer 192 is peeled off may have been deposited on the SiC wafer 192 that has been peeled off from the single-crystal SiC ingot 170 in the wafer peeling unit 8. In the first wafer delivery step, rather than the first suction member 154 that is used to deliver the SiC wafer 192 after it has been cleaned by the wafer cleaning unit 116, the second suction member 158 is used. Therefore, the liquid 106 and the peeled-off debris are prevented from being deposited on the first suction member 154 and hence from being deposited again on the SiC wafer 192 after it has been cleaned by the wafer cleaning unit 116.

Figure 18:
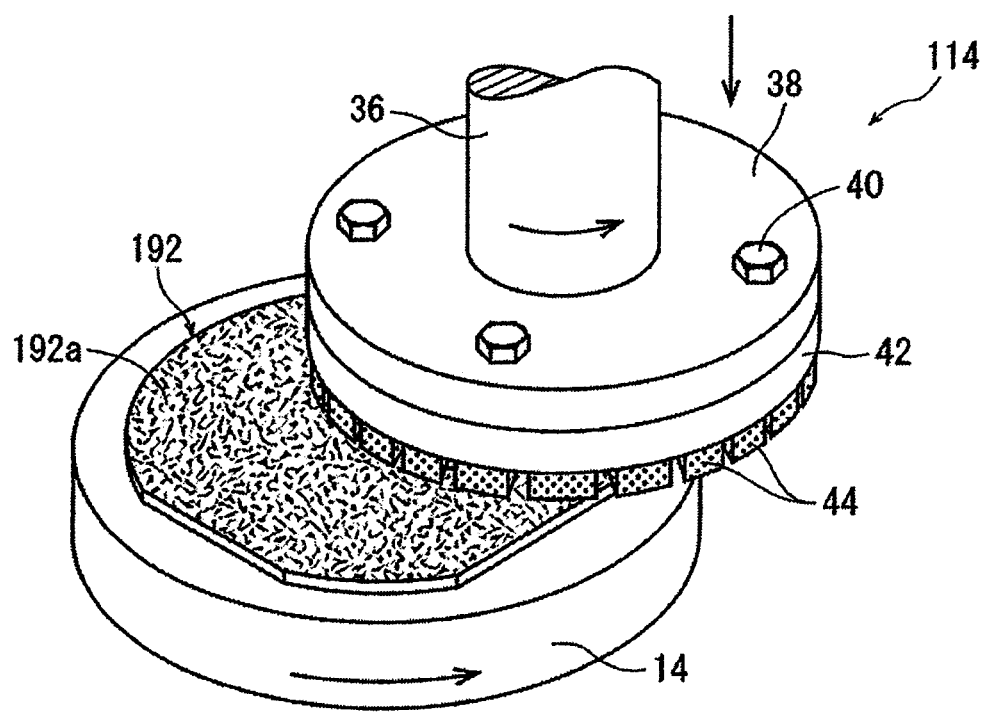
FIG. 18 is a perspective view depicting the manner in which a wafer grinding step is carried out on the wafer.

After the first wafer delivery step has been performed, the wafer grinding unit 114 carries out a wafer grinding step in which the first holding table 14 holds the SiC wafer 192 that has been peeled off from the single-crystal SiC ingot 170, and the wafer grinding unit 114 grinds and planarizes the peeled face 192a of the SiC wafer 192 held on the first holding table 14. The wafer grinding step will be described in detail below with reference to FIG. 18. In the wafer grinding step, the suction means connected to the suction chuck 22 of the first holding table 14 is actuated to generate a suction force on the upper surface of the suction chuck 22, enabling the first holding table 14 to attract and hold under suction the SiC wafer 192 from the face thereof that is opposite the peeled face 192a. The suction chuck 22 of the wafer grinding unit 114 is of such a size that the entire upper surface thereof can be covered by the SiC wafer 192, and hence the first holding table 14 of the wafer grinding unit 114 is capable of attracting and holding the SiC wafer 192 under suction. Then, the turntable electric motor turns the turntable 20 about its own axis to position the first holding table 14 that is holding the SiC wafer 192 thereon in a grinding position (which is the same as the grinding position (remoter from the viewer of FIG. 2) in the ingot grinding unit 4) in the wafer grinding unit 114. Then, the first holding table electric motor rotates the first holding table 14 that is holding the SiC wafer 192 thereon, about its own axis counterclockwise as viewed from above at a predetermined speed of 300 rpm, for example. The spindle electric motor rotates the spindle 36 about its own axis counterclockwise as viewed from above at a predetermined speed of 6000 rpm, for example. Then, the lifting/lowering electric motors 34 are energized to lower the spindle housing 30 to bring the grinding stones 44 into contact with the peeled face 192a of the SiC wafer 192. After having brought the grinding stones 44 into contact with the peeled face 192a, the lifting/lowering electric motors 34 lower the spindle housing 30 at a predetermined grinding feed speed of 1.0 μm/second, for example. The grinding stones 44 thus grind the peeled face 192a of the SiC wafer 192 that has been peeled off from the single-crystal SiC ingot 170, thereby planarizing the peeled face 192a.

After the peeled face 192a of the SiC wafer 192 has been planarized, the turntable electric motor turns the turntable 20 to put the first holding table 14 that is holding the SiC wafer 192 in the wafer loading/unloading position, and the suction means connected to the suction chuck 22 is inactivated to cancel the suction force applied to the suction chuck 22. When the peeled face 192a of the SiC wafer 192 is ground and planarized, a thickness measuring instrument, not depicted, may be brought into contact with the peeled face 192a of the SiC wafer 192. If it is detected that the thickness of the SiC wafer 192 which is measured by the thickness measuring instrument has been reduced by a predetermined amount, e.g., 100 μm that is as large as the height of the surface irregularities of the peeled face 192a, then it may be decided that the peeled face 192a of the SiC wafer 192 has been planarized. In the wafer grinding step, when the peeled face 192a of the SiC wafer 192 is ground, grinding water is supplied from grinding water supply means, not depicted, to an area being ground, and the grinding water supplied to the area being ground is discharged out of the wafer grinding unit 114 through a drain hole, not depicted, defined in the base 18.

After the wafer grinding step has been carried out, the second delivery unit 130 performs a second wafer delivery step in which it delivers the SiC wafer 192 whose peeled face 192a has been planarized from the wafer grinding unit 114 to the wafer cleaning unit 116. In the second wafer delivery step, the Y-axis moving means of the second delivery unit 130 adjusts the position of the movable block 146 to a position in which the SiC wafer 192 can be transferred between the second delivery unit 130 and the wafer grinding unit 114. Then, the multi-joint arm 152 is actuated to bring one surface (the surface where the suction holes 158a are defined) of the second suction member 158 of the second delivery unit 130 into intimate contact with the peeled face 192a of the SiC wafer 192. Then, the suction means connected to the second suction member 158 is actuated to generate a suction force on the second suction member 158, enabling the second suction member 158 to attract and hold under suction the SiC wafer 192 from the peeled face 192a side. Then, the multi-joint arm 152 moves the second suction member 158 that has attracted the SiC wafer 192 under suction, and the Y-axis moving means moves the movable block 146 to a position in which the SiC wafer 192 can be transferred between the second delivery unit 130 and the wafer cleaning unit 116, e.g., a position in which the movable block 146 and the wafer cleaning unit 116 are aligned with each other in the X-axis direction, thereby bringing the face of the SiC wafer 192 that is opposite the peeled face 192a thereof into contact with the upper surface of the chuck table 48 of the wafer cleaning unit 116. Thereafter, the suction means connected to the second suction member 158 is inactivated to cancel the suction force applied to the second suction member 158, and the SiC wafer 192 is placed, with the peeled face 192a facing upwardly, on the upper surface of the chuck table 48 of the wafer cleaning unit 116. In this manner, the SiC wafer 192 whose peeled face 192a has been planarized is delivered from the wafer grinding unit 114 to the wafer cleaning unit 116.

In the second wafer delivery step, the second suction member 158 holds the SiC wafer 192 for the following reasons. Ground-off chips and grinding water may have been deposited on the SiC wafer 192 whose peeled face 192a has been planarized by the wafer grinding unit 114. In the second wafer delivery step, rather than the first suction member 154 that is used for delivering the SiC wafer 192 after it has been cleaned by the wafer cleaning unit 116, the second suction member 158 is used to deliver the SiC wafer 192. Therefore, ground-off chips and grinding water are prevented from being deposited on the first suction member 154 and hence from being deposited again on the SiC wafer 192 that has been cleaned by the wafer cleaning unit 116.

After the second wafer delivery step has been carried out, the wafer cleaning unit 116 performs a wafer cleaning step in which it cleans the SiC wafer 192 whose peeled face 192a has been planarized. In the wafer cleaning step, the suction means connected to the suction chuck 56 of the chuck table 48 is actuated to generate a suction force on the upper surface of the suction chuck 56, enabling the chuck table 48 to attract and hold under suction the SiC wafer 192 from the face thereof that is opposite the peeled face 192a. Then, the chuck table electric motor rotates the chuck table 48. The pipe 58 is connected to the cleaning water supply source, ejecting cleaning water from the ejection port 58a of the pipe 58 toward the SiC wafer 192 held on the chuck table 48. The ejected cleaning water removes ground-off chips, grinding water, etc. deposited on the SiC wafer 192, thereby cleaning the SiC wafer 192, and the cleaning water is removed from the SiC wafer 192 by centrifugal forces generated upon rotation of the chuck table 48. Then, the pipe 58 is connected to the pressurized air source, ejecting drying air from the ejection port 58a of the pipe 58 toward the SiC wafer 192 held on the chuck table 48. The ejected drying air removes cleaning water that may have not been removed from the SiC wafer 192 by the centrifugal forces generated upon rotation of the chuck table 48, thereby drying the SiC wafer 192. After the SiC wafer 192 has been cleaned and dried, the suction means connected to the suction chuck 56 is inactivated to cancel the suction force applied to the suction chuck 56.

After the wafer cleaning step has been carried out, the first delivery unit 128 and the second delivery unit 130 of the delivery unit assembly 12 perform a third wafer delivery step in which they deliver the cleaned SiC wafer 192 from the wafer cleaning unit 116 to the wafer housing unit 10 where the SiC wafer 192 is housed. In the third wafer delivery step, the Y-axis moving means of the second delivery unit 130 adjusts the position of the movable block 146 to a position in which the SiC wafer 192 can be transferred between the second delivery unit 130 and the wafer cleaning unit 116. Then, the multi-joint arm 152 is actuated to bring one surface (the surface where the suction holes 154a are defined) of the first suction member 154 of the second delivery unit 130 into intimate contact with the peeled face 192a of the SiC wafer 192. Then, the suction means connected to the first suction member 154 is actuated to generate a suction force on the first suction member 154, enabling the first suction member 154 to attract and hold under suction the SiC wafer 192 from the peeled face 192a side. Then, the multi-joint arm 152 moves the first suction member 154 that has attracted the SiC wafer 192 under suction, and the Y-axis moving means of the second delivery unit 130 moves the movable block 146 to a position in which the SiC wafer 192 can be transferred between the first delivery unit 128 and the second delivery unit 130. At this time, the movable block 134 of the first delivery unit 128 has been put in the position in which the SiC wafer 192 can be transferred between the first delivery unit 128 and the second delivery unit 130.

Then, the multi-joint arm 140 of the first delivery unit 128 is actuated and the multi-joint arm 152 of the second delivery unit 130 is actuated to bring one surface (the surface where the suction holes 142a are defined) of the suction member 142 of the first delivery unit 128 into intimate contact with the face of the SiC wafer 192 that is opposite the peeled face 192a thereof. Then, the suction means connected to the first suction member 154 of the second delivery unit 130 is inactivated to cancel the suction force applied to the first suction member 154 of the second delivery unit 130, and the suction means connected to the suction member 142 of the first delivery unit 128 is actuated to generate a suction force on the suction member 142, enabling the suction member 142 to attract and hold under suction the SiC wafer 192 from the face of the SiC wafer 192 that is opposite the peeled face 192a thereof. The SiC wafer 192 is thus transferred from the second delivery unit 130 to the first delivery unit 128. Then, the X-axis moving means of the first delivery unit 128 adjusts the position of the movable block 134 to a position in which the SiC wafer 192 can be loaded into an arbitrary one of the wafer cassettes 120 of the wafer housing unit 10, e.g., a position in which such arbitrary one of the wafer cassettes 120 and the movable block 134 are aligned with each other in the Y-axis direction. Then, the multi-joint arm 140 of the first delivery unit 128 is actuated to load the SiC wafer 192 into the arbitrary wafer cassette 120, and the suction means connected to the suction member 142 is inactivated to cancel the suction force applied to the suction member 142. The cleaned SiC wafer 192 is thus delivered from the wafer cleaning unit 116 to the wafer housing unit 10 where the SiC wafer 192 is housed.

The various steps that are carried out on the SiC wafer 192 that has been peeled off from the single-crystal SiC ingot 170 by the wafer producing apparatus 2 have been described above particularly with respect to the processing of one SiC wafer 192. In the wafer producing apparatus 2, however, after the first wafer delivery step for delivering an SiC wafer 192 that has been peeled off from the single-crystal SiC ingot 170 from the wafer peeling unit 8 to the wafer grinding unit 114 has been carried out, the first wafer delivery step is repeatedly carried out at appropriate time intervals, and the wafer grinding step, the second wafer delivery step, the wafer cleaning step, and the third wafer delivery step are repeatedly performed concurrently on a plurality of SiC wafers 192 that have been peeled off from the single-crystal SiC ingots 170, thereby planarizing and cleaning the SiC wafers 192 that have been peeled off from the single-crystal SiC ingots 170 and successively housing the SiC wafers 192 in the wafer housing unit 10. In the case where a pair of first holding tables 14 are mounted on the turntable 20 as with the wafer grinding unit 114 according to the present embodiment, when an SiC wafer 192 is ground by the grinding means 16, a next SiC wafer 192 may be delivered to the first holding table 14 that has been put in the wafer loading/unloading position, thereby making the wafer grinding unit 114 efficient in operation.

According to the present embodiment, as described above, the wafer producing apparatus 2 includes at least the ingot grinding unit 4 that includes at least the first holding table 14 for holding the single-crystal SiC ingot 170 thereon and the grinding means 16 for grinding and planarizing the upper surface of the single-crystal SiC ingot 170 held on the first holding table 14, the laser applying unit 6 that includes at least the second holding table 60 for holding the single-crystal SiC ingot 170 thereon and the laser applying means 62 for applying the pulsed laser beam LB having the wavelength that is transmittable through the single-crystal SiC ingot 170 while positioning the focal point FP of the pulsed laser beam LB in the single-crystal SiC ingot 170 at the depth corresponding to the thickness of the SiC wafer 192 to be produced from the upper surface of the single-crystal SiC ingot 170 held on the second holding table 60, thereby forming the peel-off layer 190 in the single-crystal SiC ingot 170, the wafer peeling unit 8 that includes at least the third holding table 80 for holding the single-crystal SiC ingot 170 thereon and the wafer peeling means 82 for holding the upper surface of the single-crystal SiC ingot 170 held on the third holding table 80 and peeling the SiC wafer 192 off the peel-off layer 190, the wafer housing unit 10 for housing the SiC wafer 192 that has been peeled off, and the delivery unit assembly 12 for delivering the single-crystal SiC ingot 170 between the ingot grinding unit 4, the laser applying unit 6, and the wafer peeling unit 8. The wafer producing apparatus 2 is able to automatically perform a series of operating steps for producing SiC wafers 192 from the single-crystal SiC ingot 170, and hence has an increased production efficiency.

According to the present embodiment, the wafer producing apparatus 2 also includes the ingot housing unit 122 for housing the single-crystal SiC ingot 170 therein, and the delivery unit assembly 12 delivers the single-crystal SiC ingot 170 from the ingot housing unit 122 to the laser applying unit 6. When the wafer producing apparatus 2 operates with the ingot housing unit 122 housing the single-crystal SiC ingot 170 therein, the step of delivering the single-crystal SiC ingot 170 from the ingot housing unit 122 to the laser applying unit 6 can also be automated.

According to the present embodiment, furthermore, the wafer producing apparatus 2 includes the ingot cleaning unit 46 for cleaning the single-crystal SiC ingot 170, and the delivery unit assembly 12 delivers the single-crystal SiC ingot 170 from the ingot grinding unit 4 to the ingot cleaning unit 46 and also delivers the single-crystal SiC ingot 170 from the ingot cleaning unit 46 to the laser applying unit 6. The ingot grinding unit 4 can thus clean the single-crystal SiC ingot 170 on which the ingot grinding step has been performed.

According to the present embodiment, moreover, as the units are arranged independently of each other, the number of units used can be changed depending on the conditions of the single-crystal SiC ingot, such as the material, the size, etc. thereof, demands from the user, and so forth. For example, if the wafer producing apparatus 2 has each unit available as a plurality of units, then identical steps can be performed concurrently to increase the throughput of wafers per unit time. The wafer producing apparatus 2 may have more units for performing steps in a relatively long period of time than units for performing steps in a relatively short period of time, so that the steps are prevented from being delayed in progress for an increased production efficiency. In the present embodiment, one ingot cleaning unit 46 and one wafer cleaning unit 116 have been illustrated. However, either one of the ingot cleaning unit 46 and the wafer cleaning unit 116 may clean both the single-crystal SiC ingot 170 and the SiC wafer 192, resulting in a reduction in the space that is as large as one cleaning unit.

In the present embodiment, the single-crystal SiC ingot 170 is moved relatively to the focal point FP in the direction perpendicular to the direction A in which the off-angle α is formed in the peel-off layer forming step, whereas the focal point FP is moved relatively to the single-crystal SiC ingot 170 in the direction A in which the off-angle α is formed in the indexing-feeding process. However, the single-crystal SiC ingot 170 may not be moved relatively to the focal point FP in the direction perpendicular to the direction A in which the off-angle α is formed in the peel-off layer forming step, and the focal point FP may not be moved relatively to the single-crystal SiC ingot 170 in the direction A in which the off-angle α is formed in the indexing-feeding process.

Ordinary single-crystal SiC ingots have end faces (first and second faces) planarized to the extent that they will not obstruct the application of the pulsed laser beam LB in the peel-off layer forming step. Consequently, in the present embodiment, the single-crystal SiC ingot 170 is illustrated as being delivered from the ingot housing unit 122 to the laser applying unit 6 in the first ingot delivery step. However, if the end faces of the single-crystal SiC ingot 170 have not been planarized to the extent that they will not obstruct the application of the pulsed laser beam LB in the peel-off layer forming step, then the single-crystal SiC ingot 170 may be delivered from the ingot housing unit 122 to the ingot grinding unit 4 in the first ingot delivery step, and the steps to be repeatedly performed on the single-crystal SiC ingot 170 may begin with the ingot grinding step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing apparatus for producing an SiC wafer from a single-crystal SiC ingot, comprising:
    an ingot grinding unit that includes a first holding table for holding the single-crystal SiC ingot thereon and a grinding wheel for grinding and planarizing an upper surface of the single-crystal SiC ingot held on the first holding table;
    a laser applying unit that includes a second holding table for holding the single-crystal SiC ingot thereon and a laser oscillator for applying a pulsed laser beam having a wavelength that is transmittable through the single-crystal SiC ingot while positioning a focal point of the pulsed laser beam in the single-crystal SiC ingot at a depth corresponding to the thickness of the SiC wafer to be produced from the upper surface of the single-crystal SiC ingot held on the second holding table, thereby forming a peel-off layer in the single-crystal SiC ingot;
    a wafer peeling unit that includes a third holding table for holding the single-crystal SiC ingot thereon and a wafer peeling member for holding the upper surface of the single-crystal SiC ingot held on the third holding table and peeling the SiC wafer off the peel-off layer;
    a wafer housing unit configured to house the SiC wafer that has been peeled off; and
    a delivery unit assembly configured to deliver the single-crystal SiC ingot between the ingot grinding unit, the laser applying unit, and the wafer peeling unit,
    said delivery unit assembly including a delivery unit having a guide mechanism and a block movably attached to said guide mechanism, said block including a grip member and a suction member.

2. The wafer producing apparatus according to claim 1, further comprising:
    an ingot housing unit configured to house the single-crystal SiC ingot therein, wherein the delivery unit assembly delivers the single-crystal SiC ingot from the ingot housing unit to the laser applying unit.

3. The wafer producing apparatus according to claim 1, further comprising:
    an ingot cleaning unit configured to clean the single-crystal SiC ingot,
    wherein the delivery unit assembly delivers the single-crystal SiC ingot from the ingot grinding unit to the ingot cleaning unit and also delivers the single-crystal SiC ingot from the ingot cleaning unit to the laser applying unit.

4. The wafer producing apparatus according to claim 1, wherein said block includes an additional grip member.

5. The wafer producing apparatus according to claim 4, wherein said additional grip member includes a pair of semi-annular grippers that move between a releasing position and a gripping position.

6. The wafer producing apparatus according to claim 4, wherein said block includes an additional suction member.

7. The wafer producing apparatus according to claim 1, wherein said block includes an additional suction member.

8. The wafer producing apparatus according to claim 1, wherein said grip member includes a pair of semi-annular grippers that move between a releasing position and a gripping position.

9. The wafer producing apparatus according to claim 1, wherein said suction member includes a multi-joint arm.

* * * * *